(12) United States Patent
Klinger et al.

(10) Patent No.: US 11,042,676 B2
(45) Date of Patent: Jun. 22, 2021

(54) REPRESENTING STRUCTURAL UNCERTAINTY IN A MESH REPRESENTING A GEOLOGICAL ENVIRONMENT

(71) Applicant: Schlumberger Technology Corporation, Sugar Land, TX (US)

(72) Inventors: Jimmy Klinger, Stavanger (NO); Thomas Laverne, Montpellier (FR)

(73) Assignee: Schlumberger Technology Corporation, Sugar Land, TX (US)

( * ) Notice: Subject to any disclaimer, the term of this patent is extended or adjusted under 35 U.S.C. 154(b) by 517 days.

(21) Appl. No.: 15/773,075

(22) PCT Filed: Nov. 3, 2016

(86) PCT No.: PCT/EP2016/076529
§ 371 (c)(1),
(2) Date: May 2, 2018

(87) PCT Pub. No.: WO2017/076958
PCT Pub. Date: May 11, 2017

(65) Prior Publication Data
US 2018/0322232 A1    Nov. 8, 2018

(30) Foreign Application Priority Data
Nov. 4, 2015   (FR) ...................................... 1560580

(51) Int. Cl.
*G01V 99/00*      (2009.01)
*G06F 30/23*      (2020.01)
*E21B 41/00*      (2006.01)

(52) U.S. Cl.
CPC .............. *G06F 30/23* (2020.01); *E21B 41/00* (2013.01); *G01V 99/005* (2013.01); *G01V 2210/667* (2013.01)

(58) Field of Classification Search
CPC .................. G06F 30/23; G01V 99/005; G01V 2210/667; E21B 41/00
(Continued)

(56) References Cited

U.S. PATENT DOCUMENTS 6,014,343 A    1/2000 Graf et al.
6,549,854 B1 * 4/2003 Malinverno ........... G01V 1/282
                                                                                702/16

(Continued)

FOREIGN PATENT DOCUMENTS

EP        2975437 A1    1/2016
WO   2015/031749 A1    3/2015

OTHER PUBLICATIONS

Thore et al., Structural uncertainties: determination, management and applications, 2002, Geophysics, 67(3), pp. 840-852.*
(Continued)

*Primary Examiner* — Juan C Ochoa

(57) ABSTRACT

A method can include receiving a node-based mesh that represents a geologic environment and a structural feature in the geologic environment; defining a node-based parameter space for structural uncertainty of nodes that represent the structural feature in the geologic environment; defining a hull with respect to nodes of a portion of the mesh where the hull encompasses at least a portion of nodes that represent the structural feature; for a system of equations, imposing boundary conditions on the nodes of the hull and on the at least a portion of the nodes that represent the structural feature; solving the system of equations for a displacement field; and generating a structural uncertainty realization of the node-based mesh based at least in part on the displacement field.

20 Claims, 17 Drawing Sheets

(58) Field of Classification Search
USPC .................................................. 703/10, 2
See application file for complete search history.

(56) References Cited

U.S. PATENT DOCUMENTS

| | | | |
|---|---|---|---|
| 7,111,681 B2* | 9/2006 | Detournay | ............. E21B 43/26 |
| | | | 166/250.1 |
| 8,600,708 B1 | 12/2013 | Mallet et al. | |
| 2008/0129731 A1* | 6/2008 | Spicer | ................... G06T 17/30 |
| | | | 345/423 |
| 2011/0106507 A1 | 5/2011 | Lepage | |
| 2011/0115787 A1* | 5/2011 | Kadlec | ..................... G06T 7/12 |
| | | | 345/419 |
| 2011/0257949 A1* | 10/2011 | Vasudevan | ............. G06F 17/18 |
| | | | 703/2 |
| 2012/0271552 A1* | 10/2012 | Dashevsky | .......... G01V 11/002 |
| | | | 702/17 |
| 2014/0095078 A1* | 4/2014 | Leahy | .................... G01V 1/345 |
| | | | 702/16 |
| 2014/0163943 A1 | 6/2014 | Bukhgeym et al. | |
| 2014/0222403 A1 | 8/2014 | Lepage et al. | |
| 2014/0278298 A1 | 9/2014 | Maerten | |
| 2015/0066460 A1 | 3/2015 | Klinger et al. | |
| 2017/0115412 A1* | 4/2017 | Pixton | .................... G01V 1/282 |
| 2018/0031719 A1 | 2/2018 | Huang et al. | |
| 2019/0235106 A1 | 8/2019 | Dev et al. | |

OTHER PUBLICATIONS

International Search Report and Written Opinion for the cross referenced International patent application PCT/IB2016/001642 dated Mar. 30, 2017.
Souche, et al., "IPTC-18216-MS Construction of Structurally and Stratigraphically Consistent Structural Models Using the Volume-Based Modelling Technology: Applications to an Australian Dataset," Dec. 10, 2014, pp. 1-12.
Wellmann, et al., "Towards incorporating uncertainty of structural ddata in 3D geological inversion," Tectonophysics, Apr. 19, 2010.
Office Action for the equivalent French patent application 1560580 dated Feb. 8, 2016.
Office Action for the equivalent French patent application for 1560580 dated Jul. 22, 2016.
International Search Report and Written Opinion for the equivalent International patent application PCT/EP2016/076529 dated Feb. 21, 2017.
International Preliminary Report on Patentability for the equivalent International patent application PCT/EP2016/076529 dated May 17, 2018.
Tertois, A.-L., et al., "Fault uncertainty and ranking in tetrahedral models", 27th GOCAD Meeting, Jun. 2007, 8 pages.
Mallet, J.-L. et al., "Assessing Geometric Uncertainty in Solid Earth Models", 30th GOCAD Meeting, Jun. 2010, 7 pages.
International Preliminary Report on Patentability International patent application PCT/IB2016/001642 dated Apr. 16, 2019.

* cited by examiner

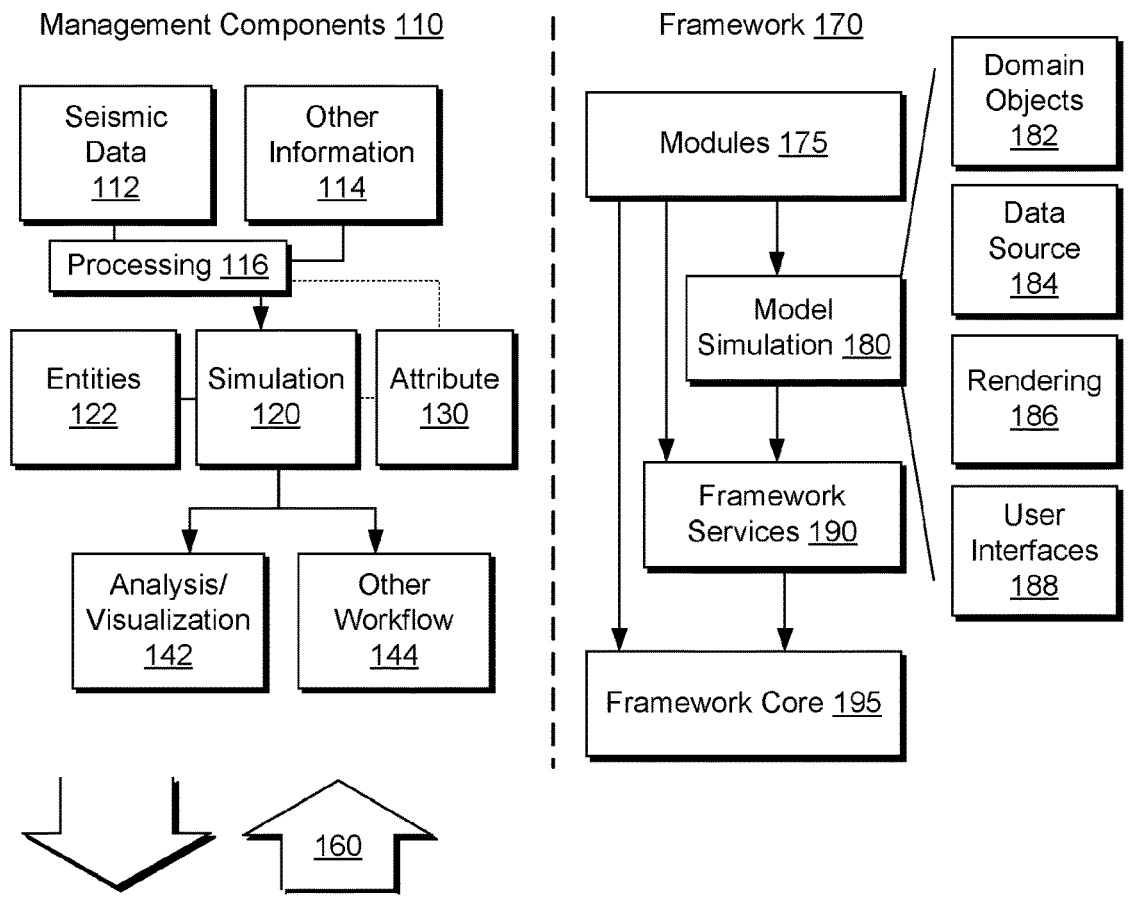
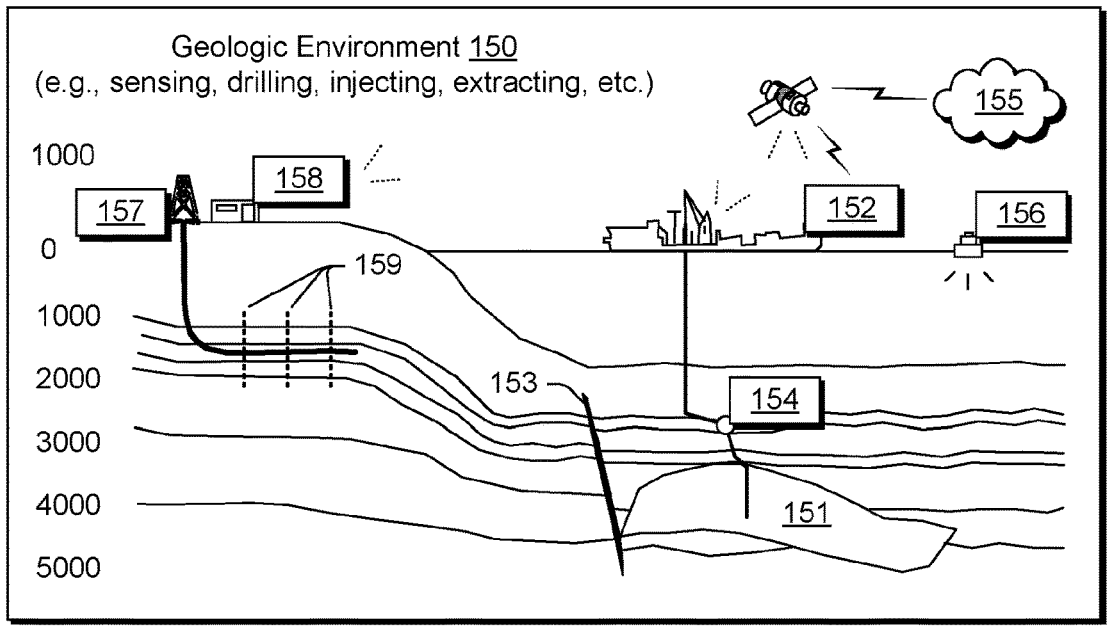
Fig. 1

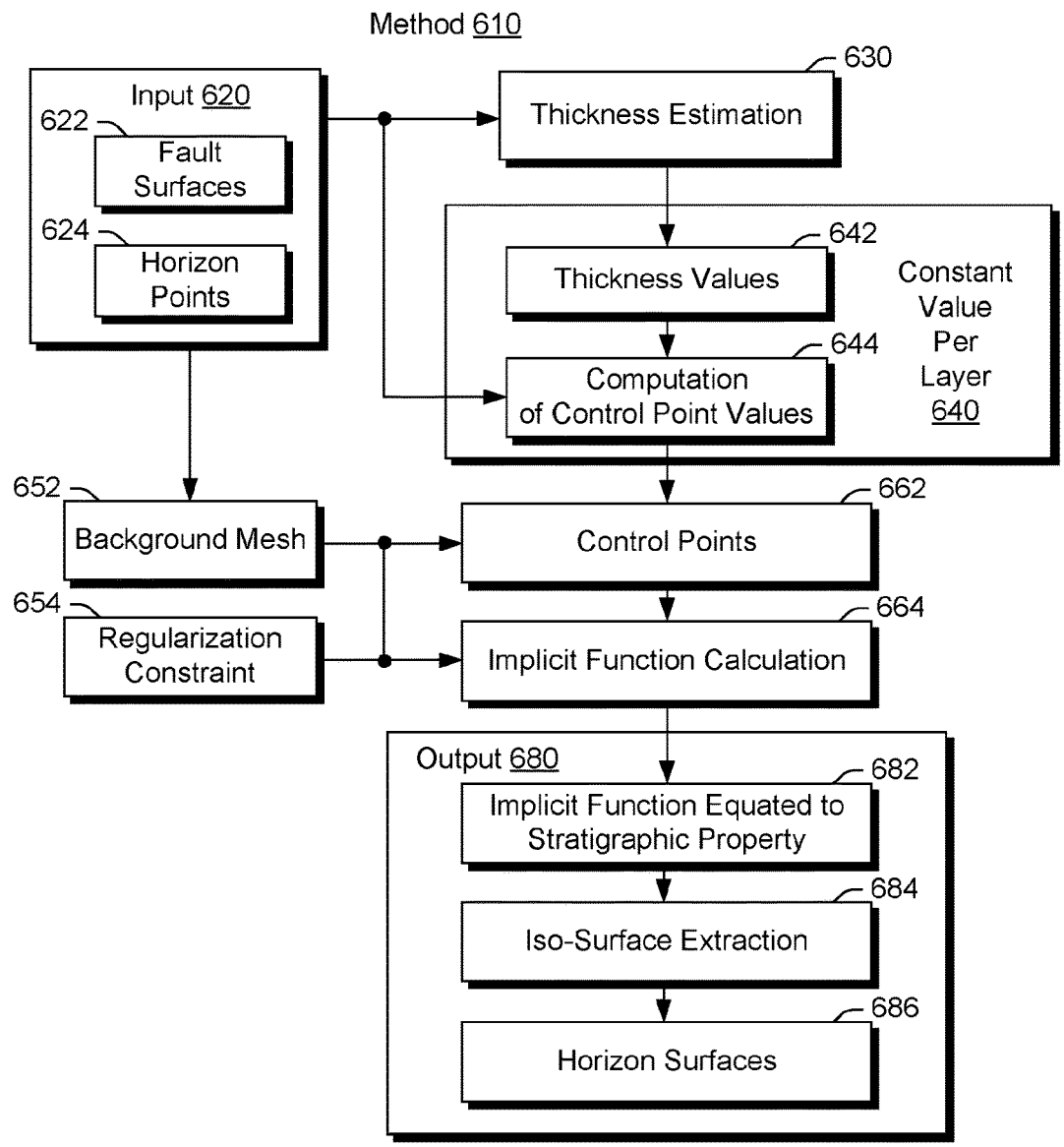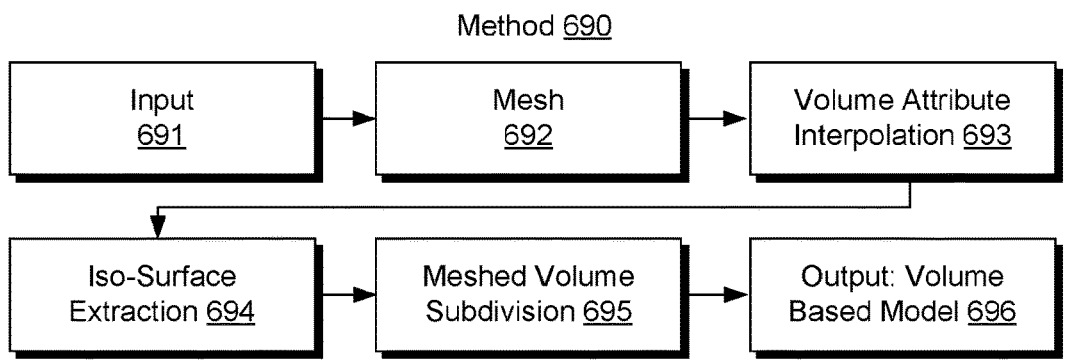
Fig. 6

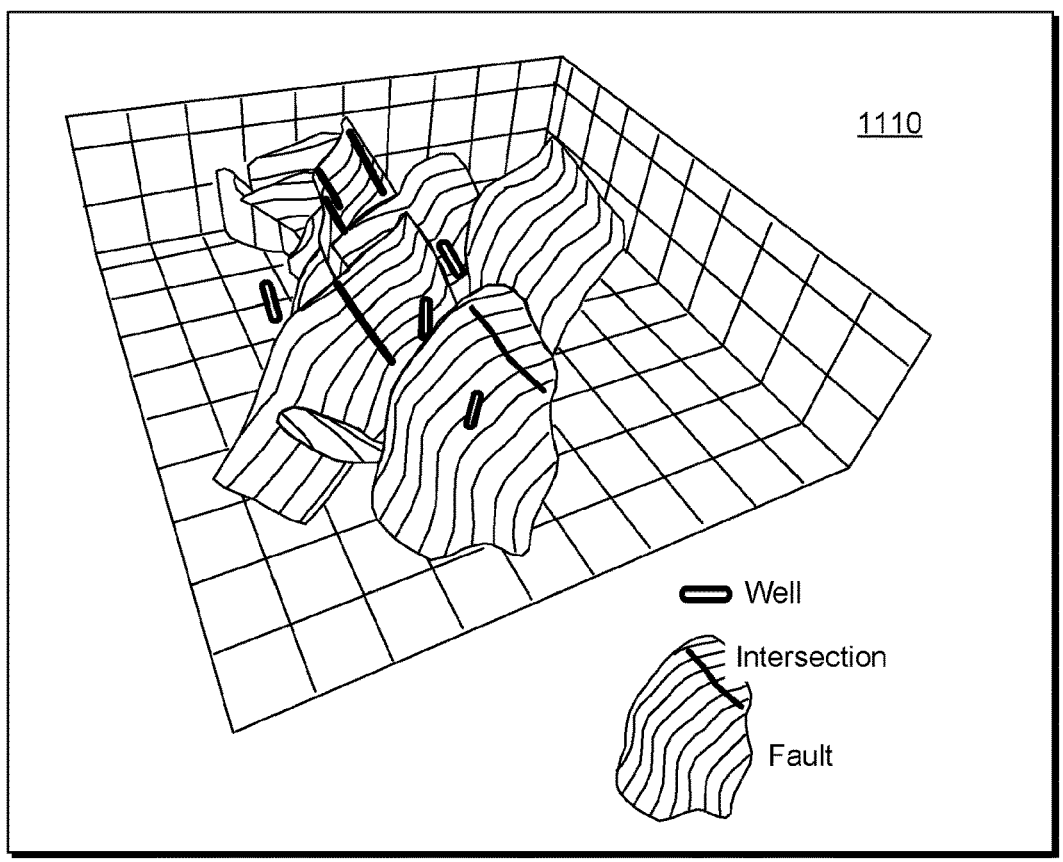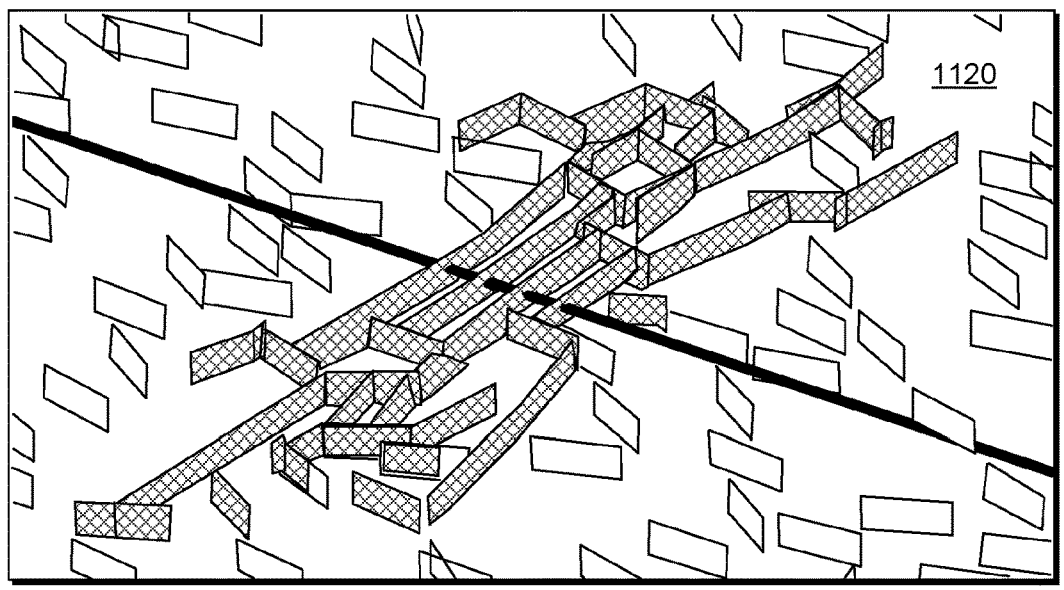
Fig. 11

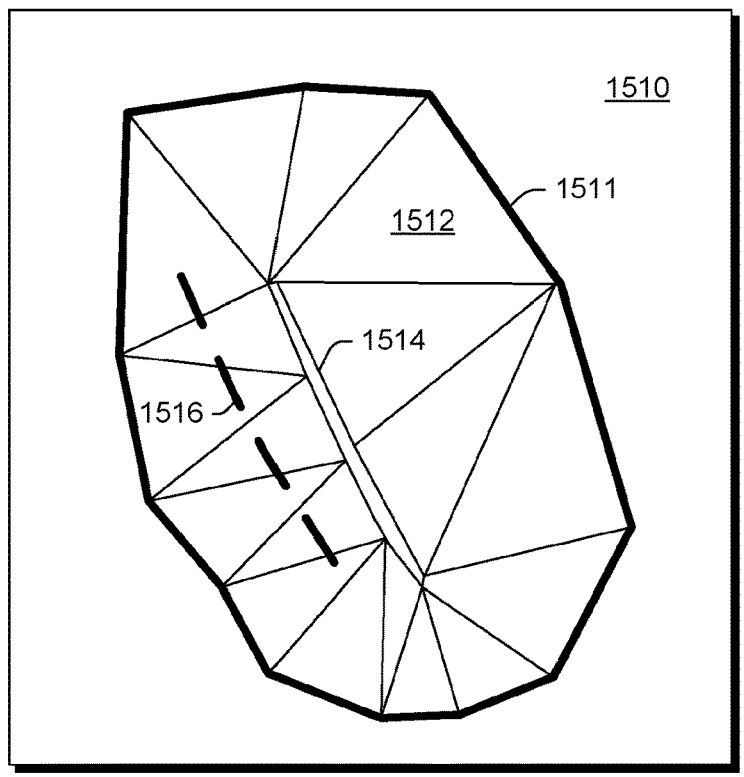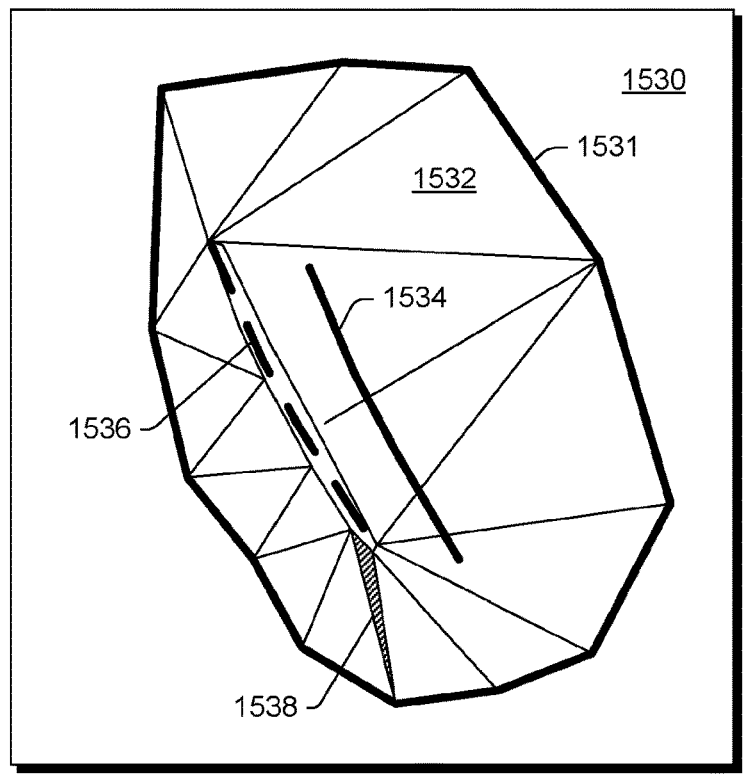
Fig. 15

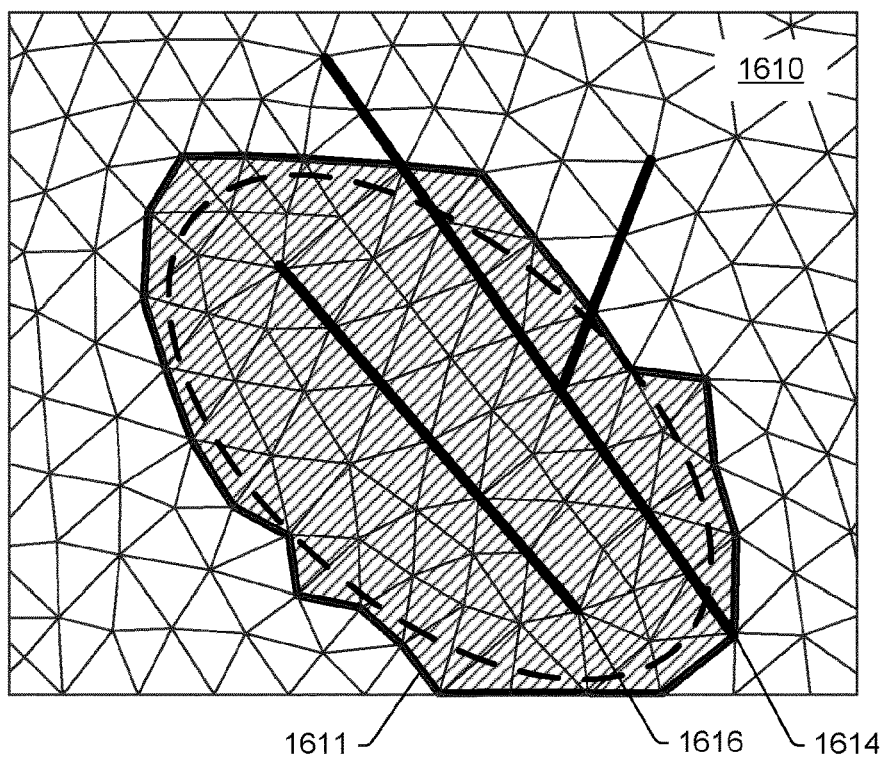
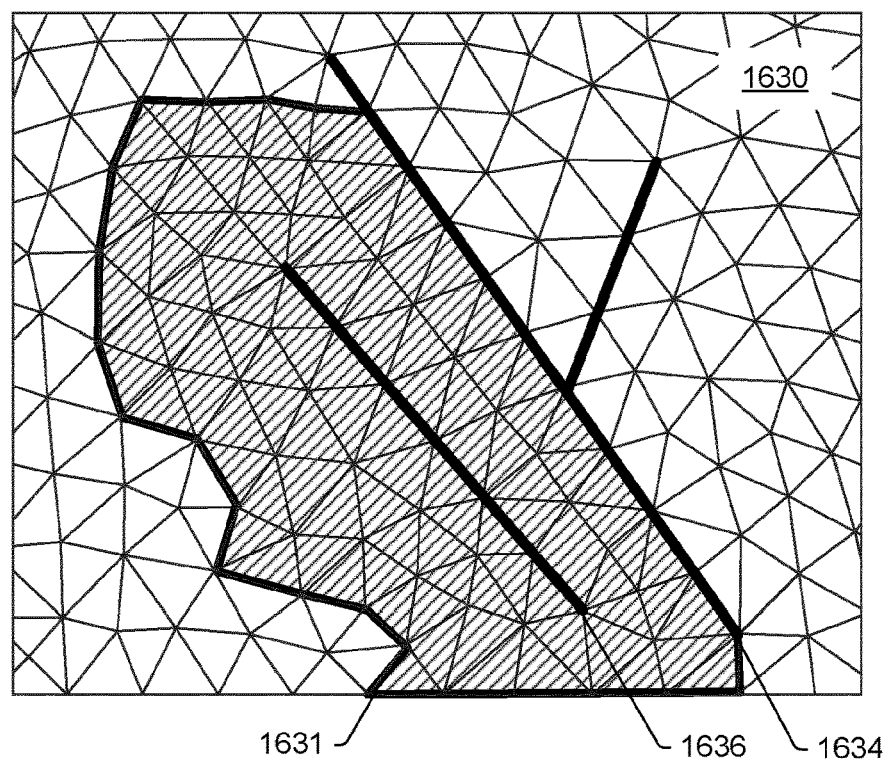
Fig. 16

System 1700

Data Analysis 1710
- Interpretation
- Attribute Calculation
- Uncertainty
- Other

Mesh Building 1720
- Nodes
- Triangles
- Tetrahedra
- Other

Parameter Space Definition 1730
- Shape
- Parameter(s)
- Uncertainty
- Other

Hull Definition 1740
- Shape
- Connectivity
- Feature(s)
- Other

Simulation 1750
- Mesh(es)
- Hull(s)
- Result(s)
- Other

Implicit Function 1760
- Mesh(es)
- Conformities/Unconformities
- Interpolation(s)
- Other

Fig. 17

REPRESENTING STRUCTURAL UNCERTAINTY IN A MESH REPRESENTING A GEOLOGICAL ENVIRONMENT

FIELD OF THE INVENTION

Disclosed embodiments relate generally to structural uncertainty in a mesh representing a geological environment.

BACKGROUND

Phenomena associated with a sedimentary basin may be modeled using a mesh, a grid, etc. As an example, a structural model may be created based on data associated with a sedimentary basin. For example, where a basin includes various types of features (e.g., stratigraphic layers, faults, etc.), data associated with such features may be used to create a structural model of the basin. Such a model may be a basis for analysis, further modeling, etc.

SUMMARY

A method can include receiving a node-based mesh that represents a geologic environment and a structural feature in the geologic environment; defining a node-based parameter space for structural uncertainty of nodes that represent the structural feature in the geologic environment; defining a hull with respect to nodes of a portion of the mesh where the hull encompasses at least a portion of nodes that represent the structural feature; for a system of equations, imposing boundary conditions on the nodes of the hull and on the at least a portion of the nodes that represent the structural feature; solving the system of equations for a displacement field; and generating a structural uncertainty realization of the node-based mesh based at least in part on the displacement field. A system can include a processor; memory operatively coupled to the processor; and one or more modules that include instructions stored in the memory and executable by the processor to instruct the system where the instructions include instructions to: receive a node-based mesh that represents a geologic environment and a structural feature in the geologic environment; define a node-based parameter space for structural uncertainty of nodes that represent the structural feature in the geologic environment; define a hull with respect to nodes of a portion of the mesh where the hull encompasses at least a portion of nodes that represent the structural feature; for a system of equations, impose boundary conditions on the nodes of the hull and on the at least a portion of the nodes that represent the structural feature; solve the system of equations for a displacement field; and generate a structural uncertainty realization of the node-based mesh based at least in part on the displacement field. One or more computer-readable storage media can include computer-executable instructions to instruct a computing device where the instructions include instructions to: receive a node-based mesh that represents a geologic environment and a structural feature in the geologic environment; define a node-based parameter space for structural uncertainty of nodes that represent the structural feature in the geologic environment; define a hull with respect to nodes of a portion of the mesh where the hull encompasses at least a portion of nodes that represent the structural feature; for a system of equations, impose boundary conditions on the nodes of the hull and on the at least a portion of the nodes that represent the structural feature; solve the system of equations for a displacement field; and generate a structural uncertainty realization of the node-based mesh based at least in part on the displacement field. Various other apparatuses, systems, methods, etc., are also disclosed.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

FIG. 1 illustrates an example system that includes various components for simulating a geological environment;

FIG. 6 illustrates examples of methods;

FIG. 11 illustrates examples of geologic environments;

FIG. 15 illustrates examples of mesh deformation;

FIG. 16 illustrates examples of hull definition;

FIG. 17 illustrates an example of a system; and

DETAILED DESCRIPTION

Figure 2:
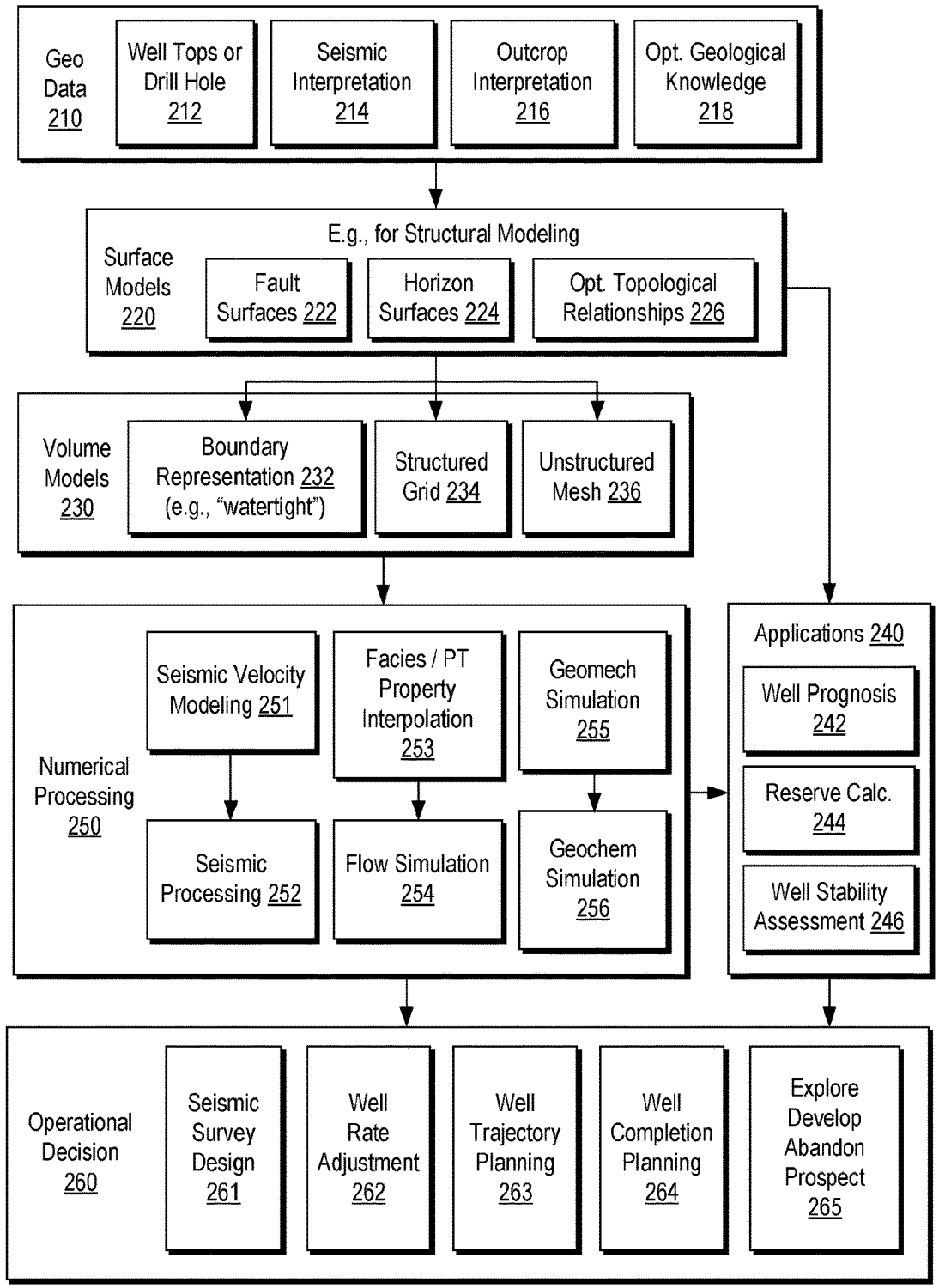
FIG. 2 illustrates an example of a system.

This description is not to be taken in a limiting sense, but rather is made merely for the purpose of describing the general principles of the implementations. The scope of the described implementations should be ascertained with reference to the issued claims.

Phenomena associated with a sedimentary basin (e.g., a subsurface region, whether below a ground surface, water surface, etc.) may be modeled using a model or models. As an example, a structural model of a basin may find use for understanding various processes related to exploration and production of natural resources (estimating reserves in place, drilling wells, forecasting production, etc.). As an example, a structural model may be used as a basis for building a model for use with a numerical technique.

For application of a numerical technique, equations may be discretized using a grid that includes nodes, cells, etc. To represent features in a geologic environment, a structural model may assist with properly locating nodes, cells, etc. of a grid for use in simulation using one or more numerical techniques. As an example, a structural model may itself include a mesh, which may, at times be referred to as a grid. As an example, a structural model may provide for analysis optionally without resorting to creation of a grid suited for discretization of equations for a numerical solver (e.g., consider a structured grid that may reduce computational demands, etc.).

As to numerical techniques, a numerical technique such as the finite difference method can include discretizing a 1D differential heat equation for temperature with respect to a spatial coordinate to approximate temperature derivatives (e.g., first order, second order, etc.). Where time is of interest, a derivative of temperature with respect to time may also be provided. As to the spatial coordinate, the numerical technique may rely on a spatial grid that includes various nodes where a temperature will be provided for each node upon solving the heat equation (e.g., subject to boundary conditions, generation terms, etc.). Such an example may apply to multiple dimensions in space (e.g., where discretization is applied to the multiple dimensions). Thus, a grid may discretize a volume of interest (VOI) into elementary elements (e.g., cells or grid blocks) that may be assigned or associated with properties (e.g. porosity, rock type, etc.), which may be germane to simulation of physical processes (e.g., fluid flow, reservoir compaction, etc.).

As another example of a numerical technique, consider the finite element method where space may be represented by one dimensional or multi-dimensional "elements". For one spatial dimension, an element may be represented by two nodes positioned along a spatial coordinate. For multiple spatial dimensions, an element may include any number of nodes. Further, some equations may be represented by certain nodes while others are represented by fewer nodes (e.g., consider an example for the Navier-Stokes equations where fewer nodes represent pressure). The finite element method may include providing nodes that can define triangular elements (e.g., tetrahedra in 3D, higher order simplexes in multidimensional spaces, etc.) or quadrilateral elements (e.g., hexahedra or pyramids in 3D, etc.), or polygonal elements (e.g., prisms in 3D, etc.). Such elements, as defined by corresponding nodes of a grid, may be referred to as grid cells.

Yet another example of a numerical technique is the finite volume method. For the finite volume method, values for model equation variables may be calculated at discrete places on a grid, for example, a node of the grid that includes a "finite volume" surrounding it. The finite volume method may apply the divergence theorem for evaluation of fluxes at surfaces of each finite volume such that flux entering a given finite volume equals that leaving to one or more adjacent finite volumes (e.g., to adhere to conservation laws). For the finite volume method, nodes of a grid may define grid cells.

As mentioned, where a sedimentary basin (e.g., subsurface region) includes various types of features (e.g., stratigraphic layers, faults, etc.) where nodes, cells, etc. of a mesh or grid may represent, or be assigned to, such features. As an example, consider a structural model that may include one or more meshes. Such a model may serve as a basis for formation of a grid for discretized equations to represent a sedimentary basin and its features.

As to a stratigraphic sequence, a sedimentary basin may include sedimentary deposits grouped into stratigraphic units, for example, based on any of a variety of factors, to approximate or represent time lines that place stratigraphy in a chronostratigraphic framework. While sequence stratigraphy is mentioned, lithostratigraphy may be applied, for example, based on similarity of lithology of rock units (e.g., rather than time-related factors).

As an example, a mesh may conform to structural features such as, for example, Y-faults, X-faults, low-angle unconformities, salt bodies, intrusions, etc. (e.g., geological discontinuities), to more fully capture complexity of a geological model. As an example, a mesh may optionally conform to stratigraphy (e.g., in addition to one or more geological discontinuities). As to geological discontinuities, these may include model discontinuities such as one or more model boundaries. As an example, a mesh may be populated with property fields generated, for example, by geostatistical methods.

In general, a relationship may exist between node spacing and phenomenon or phenomena being modeled. Various scales may exist within a geologic environment, for example, a molecular scale may be on the order of approximately $10^{-9}$ to approximately $10^{-8}$ meters, a pore scale may be on the order of approximately $10^{-6}$ to approximately $10^{-3}$ meters, bulk continuum may be on the order of approximately $10^{-3}$ to approximately $10^{-2}$ meters, and a basin scale on the order of approximately $10^3$ to approximately $10^5$ meters. As an example, nodes of a mesh may be selected based at least in part on the type of phenomenon or phenomena being modeled (e.g., to select nodes of appropriate spacing or spacings). As an example, nodes of a grid may include node-to-node spacing of about 10 meters to about 500 meters. In such an example, a basin being modeled may span, for example, over approximately $10^3$ meters. As an example, node-to-node space may vary, for example, being smaller or larger than the aforementioned spacings.

Some data may be involved in building an initial mesh and, thereafter, a model, a corresponding mesh, etc. may optionally be updated in response to model output, changes in time, physical phenomena, additional data, etc. Data may include one or more of the following: depth or thickness maps and fault geometries and timing from seismic, remote-sensing, electromagnetic, gravity, outcrop and well log data. Furthermore, data may include depth and thickness maps stemming from facies variations.

FIG. 1 shows an example of a system 100 that includes various management components 110 to manage various aspects of a geologic environment 150 (e.g., an environment that includes a sedimentary basin, a reservoir 151, one or more fractures 153, etc.). For example, the management components 110 may allow for direct or indirect management of sensing, drilling, injecting, extracting, etc., with respect to the geologic environment 150. In turn, further information about the geologic environment 150 may become available as feedback 160 (e.g., optionally as input to one or more of the management components 110).

In the example of FIG. 1, the management components 110 include a seismic data component 112, an additional information component 114 (e.g., well/logging data), a processing component 116, a simulation component 120, an attribute component 130, an analysis/visualization component 142 and a workflow component 144. In operation, seismic data and other information provided per the components 112 and 114 may be input to the simulation component 120.

In an example embodiment, the simulation component 120 may rely on entities 122. Entities 122 may include earth entities or geological objects such as wells, surfaces, reservoirs, etc. In the system 100, the entities 122 can include virtual representations of actual physical entities that are reconstructed for purposes of simulation. The entities 122 may include entities based on data acquired via sensing, observation, etc. (e.g., the seismic data 112 and other information 114). An entity may be characterized by one or more properties (e.g., a geometrical pillar grid entity of an earth model may be characterized by a porosity property). Such properties may represent one or more measurements (e.g., acquired data), calculations, etc.

In an example embodiment, the simulation component 120 may operate in conjunction with a software framework such as an object-based framework. In such a framework, entities may include entities based on pre-defined classes to facilitate modeling and simulation. A commercially available example of an object-based framework is the MICROSOFT® .NET™ framework (Redmond, Wash.), which provides a set of extensible object classes. In the .NET™ framework, an object class encapsulates a module of reusable code and associated data structures. Object classes can be used to instantiate object instances for use in by a program, script, etc. For example, borehole classes may define objects for representing boreholes based on well data.

In the example of FIG. 1, the simulation component 120 may process information to conform to one or more attributes specified by the attribute component 130, which may include a library of attributes. Such processing may occur prior to input to the simulation component 120 (e.g., consider the processing component 116). As an example, the simulation component 120 may perform operations on input information based on one or more attributes specified by the attribute component 130. In an example embodiment, the simulation component 120 may construct one or more models of the geologic environment 150, which may be relied on to simulate behavior of the geologic environment 150 (e.g., responsive to one or more acts, whether natural or artificial). In the example of FIG. 1, the analysis/visualization component 142 may allow for interaction with a model or model-based results (e.g., simulation results, etc.). As an example, output from the simulation component 120 may be input to one or more other workflows, as indicated by a workflow component 144.

As an example, the simulation component 120 may include one or more features of a simulator such as the ECLIPSE' reservoir simulator (Schlumberger Limited, Houston Tex.), the INTERSECT' reservoir simulator (Schlumberger Limited, Houston Tex.), etc. As an example, a reservoir or reservoirs may be simulated with respect to one or more enhanced recovery techniques (e.g., consider a thermal process such as SAGD, etc.).

In an example embodiment, the management components 110 may include features of a commercially available framework such as the PETREL® seismic to simulation software framework (Schlumberger Limited, Houston, Tex.). The PETREL® framework provides components that allow for optimization of exploration and development operations. The PETREL® framework includes seismic to simulation software components that can output information for use in increasing reservoir performance, for example, by improving asset team productivity. Through use of such a framework, various professionals (e.g., geophysicists, geologists, and reservoir engineers) can develop collaborative workflows and integrate operations to streamline processes. Such a framework may be considered an application and may be considered a data-driven application (e.g., where data is input for purposes of modeling, simulating, etc.).

In an example embodiment, various aspects of the management components 110 may include add-ons or plug-ins that operate according to specifications of a framework environment. For example, a commercially available framework environment marketed as the OCEAN® framework environment (Schlumberger Limited, Houston, Tex.) allows for integration of add-ons (or plug-ins) into a PETREL® framework workflow. The OCEAN® framework environment leverages .NET® tools (Microsoft Corporation, Redmond, Wash.) and offers stable, user-friendly interfaces for efficient development. In an example embodiment, various components may be implemented as add-ons (or plug-ins) that conform to and operate according to specifications of a framework environment (e.g., according to application programming interface (API) specifications, etc.).

FIG. 1 also shows an example of a framework 170 that includes a model simulation layer 180 along with a framework services layer 190, a framework core layer 195 and a modules layer 175. The framework 170 may include the commercially available OCEAN® framework where the model simulation layer 180 is the commercially available PETREL® model-centric software package that hosts OCEAN® framework applications. In an example embodiment, the PETREL® software may be considered a data-driven application. The PETREL® software can include a framework for model building and visualization. Such a model may include one or more grids.

The model simulation layer 180 may provide domain objects 182, act as a data source 184, provide for rendering 186 and provide for various user interfaces 188. Rendering 186 may provide a graphical environment in which applications can display their data while the user interfaces 188 may provide a common look and feel for application user interface components.

In the example of FIG. 1, the domain objects 182 can include entity objects, property objects and optionally other objects. Entity objects may be used to geometrically represent wells, surfaces, reservoirs, etc., while property objects may be used to provide property values as well as data versions and display parameters. For example, an entity object may represent a well where a property object provides log information as well as version information and display information (e.g., to display the well as part of a model).

In the example of FIG. 1, data may be stored in one or more data sources (or data stores, generally physical data storage devices), which may be at the same or different physical sites and accessible via one or more networks. The model simulation layer 180 may be configured to model projects. As such, a particular project may be stored where stored project information may include inputs, models, results and cases. Thus, upon completion of a modeling session, a user may store a project. At a later time, the project can be accessed and restored using the model simulation layer 180, which can recreate instances of the relevant domain objects.

In the example of FIG. 1, the geologic environment 150 may include layers (e.g., stratification) that include a reservoir 151 and that may be intersected by a fault 153. As an example, the geologic environment 150 may be outfitted with any of a variety of sensors, detectors, actuators, etc. For example, equipment 152 may include communication circuitry to receive and to transmit information with respect to one or more networks 155. Such information may include information associated with downhole equipment 154, which may be equipment to acquire information, to assist with resource recovery, etc. Other equipment 156 may be located remote from a well site and include sensing, detecting, emitting or other circuitry. Such equipment may include storage and communication circuitry to store and to communicate data, instructions, etc. As an example, one or more satellites may be provided for purposes of communications, data acquisition, etc. For example, FIG. 1 shows a satellite in communication with the network 155 that may be configured for communications, noting that the satellite may additionally or alternatively include circuitry for imagery (e.g., spatial, spectral, temporal, radiometric, etc.).

FIG. 1 also shows the geologic environment 150 as optionally including equipment 157 and 158 associated with a well that includes a substantially horizontal portion that may intersect with one or more fractures 159. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop a laterally extensive reservoir (e.g., via fracturing, injecting, extracting, etc.). As an example, the equipment 157 and/or 158 may include components, a system, systems, etc. for fracturing, seismic sensing, analysis of seismic data, assessment of one or more fractures, etc.

As mentioned, the system 100 may be used to perform one or more workflows. A workflow may be a process that includes a number of worksteps. A workstep may operate on data, for example, to create new data, to update existing data, etc. As an example, a may operate on one or more inputs and create one or more results, for example, based on one or more algorithms. As an example, a system may include a workflow editor for creation, editing, executing, etc. of a workflow. In such an example, the workflow editor may provide for selection of one or more pre-defined worksteps, one or more customized worksteps, etc. As an example, a workflow may be a workflow implementable in the PETREL® software, for example, that operates on seismic data, seismic attribute(s), etc. As an example, a workflow may be a process implementable in the OCEAN® framework. As an example, a workflow may include one or more worksteps that access a module such as a plug-in (e.g., external executable code, etc.).

As an example, reservoir simulation, petroleum systems modeling, etc. may be applied to characterize various types of subsurface environments, including environments such as those of FIG. 1.

As an example, a sedimentary basin, as a geologic environment, can include horizons, faults, one or more geobodies and facies formed over some period of geologic time. These features can be distributed in two or three dimensions in space, for example, with respect to a Cartesian coordinate system (e.g., x, y and z) or other coordinate system (e.g., cylindrical, spherical, etc.). As an example, a model building method can include a data acquisition block for acquiring data (e.g., receiving data) and a model geometry block (e.g., for modeling geometry based at least in part on data). As an example, some data may be involved in building an initial model and, thereafter, the model may optionally be updated in response to model output, changes in time, physical phenomena, additional data, etc. As an example, data for modeling may include one or more of the following: depth or thickness maps and fault geometries and timing from seismic, remote-sensing, electromagnetic, gravity, outcrop and well log data. Further, data may include depth and thickness maps stemming from facies variations (e.g., due to seismic unconformities) assumed to following geological events ("iso" times) and data may include lateral facies variations (e.g., due to lateral variation in sedimentation characteristics).

To proceed to modeling of geological processes, data may be provided, for example, data such as geochemical data (e.g., temperature, kerogen type, organic richness, etc.), timing data (e.g., from paleontology, radiometric dating, magnetic reversals, rock and fluid properties, etc.) and boundary condition data (e.g., heat-flow history, surface temperature, paleowater depth, etc.).

In basin and petroleum systems modeling, quantities such as temperature, pressure and porosity distributions within the sediments may be modeled, for example, by solving partial differential equations (PDEs) using one or more numerical techniques. Modeling may also model geometry with respect to time, for example, to account for changes stemming from geological events (e.g., deposition of material, erosion of material, shifting of material, etc.).

A commercially available modeling framework marketed as the PETROMOD® framework (Schlumberger Limited, Houston, Tex.) includes features for input of various types of information (e.g., seismic, well, geological, etc.) to model evolution of a sedimentary basin. The PETROMOD® framework provides for petroleum systems modeling via input of various data such as seismic data, well data and other geological data, for example, to model evolution of a sedimentary basin. The PETROMOD® framework may predict if, and how, a reservoir has been charged with hydrocarbons, including, for example, the source and timing of hydrocarbon generation, migration routes, quantities, pore pressure and hydrocarbon type in the subsurface or at surface conditions. In combination with a framework such as the PETREL® framework, the OCEAN® framework, etc., workflows may be constructed to provide basin-to-prospect scale exploration solutions. Data exchange between frameworks can facilitate construction of models, analysis of data (e.g., PETROMOD® framework data analyzed using PETREL® framework capabilities), and coupling of workflows.

As an example, a method may include structural modeling, for example, building a structural model, editing a structural model, etc. of a geologic environment. As an example, a workflow may include providing a structural model prior to construction of a grid (e.g., using the structural model), which may, in turn, be suitable for use with one or more numerical techniques. As an example, one or more applications may operate on a structural model (e.g., input of a structural model).

FIG. 2 shows an example of a system 200 that includes a geological/geophysical data block 210, a surface models block 220 (e.g., for one or more structural models), a volume modules block 230, an applications block 240, a numerical processing block 250 and an operational decision block 260. As shown in the example of FIG. 2, the geological/geophysical data block 210 can include data from well tops or drill holes 212, data from seismic interpretation 214, data from outcrop interpretation and optionally data from geological knowledge. As to the surface models block 220, it may provide for creation, editing, etc. of one or more surface models based on, for example, one or more of fault surfaces 222, horizon surfaces 224 and optionally topological relationships 226. As to the volume models block 230, it may provide for creation, editing, etc. of one or more volume models based on, for example, one or more of boundary representations 232 (e.g., to form a watertight model), structured grids 234 and unstructured meshes 236.

As shown in the example of FIG. 2, the system 200 may allow for implementing one or more workflows, for example, where data of the data block 210 are used to create, edit, etc. one or more surface models of the surface models block 220, which may be used to create, edit, etc. one or more volume models of the volume models block 230. As indicated in the example of FIG. 2, the surface models block 220 may provide one or more structural models, which may be input to the applications block 240. For example, such a structural model may be provided to one or more applications, optionally without performing one or more processes of the volume models block 230 (e.g., for purposes of numerical processing by the numerical processing block 250). Accordingly, the system 200 may be suitable for one or more workflows for structural modeling (e.g., optionally without performing numerical processing per the numerical processing block 250).

As to the applications block 240, it may include applications such as a well prognosis application 242, a reserve calculation application 244 and a well stability assessment application 246. As to the numerical processing block 250, it may include a process for seismic velocity modeling 251 followed by seismic processing 252, a process for facies and petrophysical property interpolation 253 followed by flow simulation 254, and a process for geomechanical simulation 255 followed by geochemical simulation 256. As indicated, as an example, a workflow may proceed from the volume models block 230 to the numerical processing block 250 and then to the applications block 240 and/or to the operational decision block 260. As another example, a workflow may proceed from the surface models block 220 to the applications block 240 and then to the operational decisions block 260 (e.g., consider an application that operates using a structural model).

In the example of FIG. 2, the operational decisions block 260 may include a seismic survey design process 261, a well rate adjustment process 252, a well trajectory planning process 263, a well completion planning process 264 and a process for one or more prospects, for example, to decide whether to explore, develop, abandon, etc. a prospect.

Referring again to the data block 210, the well tops or drill hole data 212 may include spatial localization, and optionally surface dip, of an interface between two geological formations or of a subsurface discontinuity such as a geological fault; the seismic interpretation data 214 may include a set of points, lines or surface patches interpreted from seismic reflection data, and representing interfaces between media (e.g., geological formations in which seismic wave velocity differs) or subsurface discontinuities; the outcrop interpretation data 216 may include a set of lines or points, optionally associated with measured dip, representing boundaries between geological formations or geological faults, as interpreted on the earth surface; and the geological knowledge data 218 may include, for example knowledge of the paleo-tectonic and sedimentary evolution of a region.

As to a structural model, it may be, for example, a set of gridded or meshed surfaces representing one or more interfaces between geological formations (e.g., horizon surfaces) or mechanical discontinuities (fault surfaces) in the subsurface. As an example, a structural model may include some information about one or more topological relationships between surfaces (e.g. fault A truncates fault B, fault B intersects fault C, etc.).

As to the one or more boundary representations 232, they may include a numerical representation in which a subsurface model is partitioned into various closed units representing geological layers and fault blocks wherein an individual unit may be defined by its boundary and, optionally, by a set of internal boundaries such as fault surfaces.

As to the one or more structured grids 234, it may include a grid that partitions a volume of interest into different elementary volumes (cells), for example, that may be indexed according to a pre-defined, repeating pattern. As to the one or more unstructured meshes 236, it may include a mesh that partitions a volume of interest into different elementary volumes, for example, that may not be readily indexed following a pre-defined, repeating pattern (e.g., consider a Cartesian cube with indexes I, J, and K, along x, y, and z axes).

As to the seismic velocity modeling 251, it may include calculation of velocity of propagation of seismic waves (e.g., where seismic velocity depends on type of seismic wave and on direction of propagation of the wave). As to the seismic processing 252, it may include a set of processes allowing identification of localization of seismic reflectors in space, physical characteristics of the rocks in between these reflectors, etc.

As to the facies and petrophysical property interpolation 253, it may include an assessment of type of rocks and of their petrophysical properties (e.g. porosity, permeability), for example, optionally in areas not sampled by well logs or coring. As an example, such an interpolation may be constrained by interpretations from log and core data, and by prior geological knowledge.

As to the flow simulation 254, as an example, it may include simulation of flow of hydro-carbons in the subsurface, for example, through geological times (e.g., in the context of petroleum systems modeling, when trying to predict the presence and quality of oil in an un-drilled formation) or during the exploitation of a hydrocarbon reservoir (e.g., when some fluids are pumped from or into the reservoir).

As to geomechanical simulation 255, it may include simulation of the deformation of rocks under boundary conditions. Such a simulation may be used, for example, to assess compaction of a reservoir (e.g., associated with its depletion, when hydrocarbons are pumped from the porous and deformable rock that composes the reservoir). As an example a geomechanical simulation may be used for a variety of purposes such as, for example, prediction of fracturing, reconstruction of the paleo-geometries of the reservoir as they were prior to tectonic deformations, etc.

As to geochemical simulation 256, such a simulation may simulate evolution of hydrocarbon formation and composition through geological history (e.g., to assess the likelihood of oil accumulation in a particular subterranean formation while exploring new prospects).

As to the various applications of the applications block 240, the well prognosis application 242 may include predicting type and characteristics of geological formations that may be encountered by a drill-bit, and location where such rocks may be encountered (e.g., before a well is drilled); the reserve calculations application 244 may include assessing total amount of hydrocarbons or ore material present in a subsurface environment (e.g., and estimates of which proportion can be recovered, given a set of economic and technical constraints); and the well stability assessment application 246 may include estimating risk that a well, already drilled or to-be-drilled, will collapse or be damaged due underground stress.

As to the operational decision block 260, the seismic survey design process 261 may include deciding where to place seismic sources and receivers to optimize the coverage and quality of the collected seismic information while minimizing cost of acquisition; the well rate adjustment process 262 may include controlling injection and production well schedules and rates (e.g., to maximize recovery and production); the well trajectory planning process 263 may include designing a well trajectory to maximize potential recovery and production while minimizing drilling risks and costs; the well trajectory planning process 264 may include selecting proper well tubing, casing and completion (e.g., to meet expected production or injection targets in specified reservoir formations); and the prospect process 265 may include decision making, in an exploration context, to continue exploring, start producing or abandon prospects (e.g., based on an integrated assessment of technical and financial risks against expected benefits).

Figure 3:
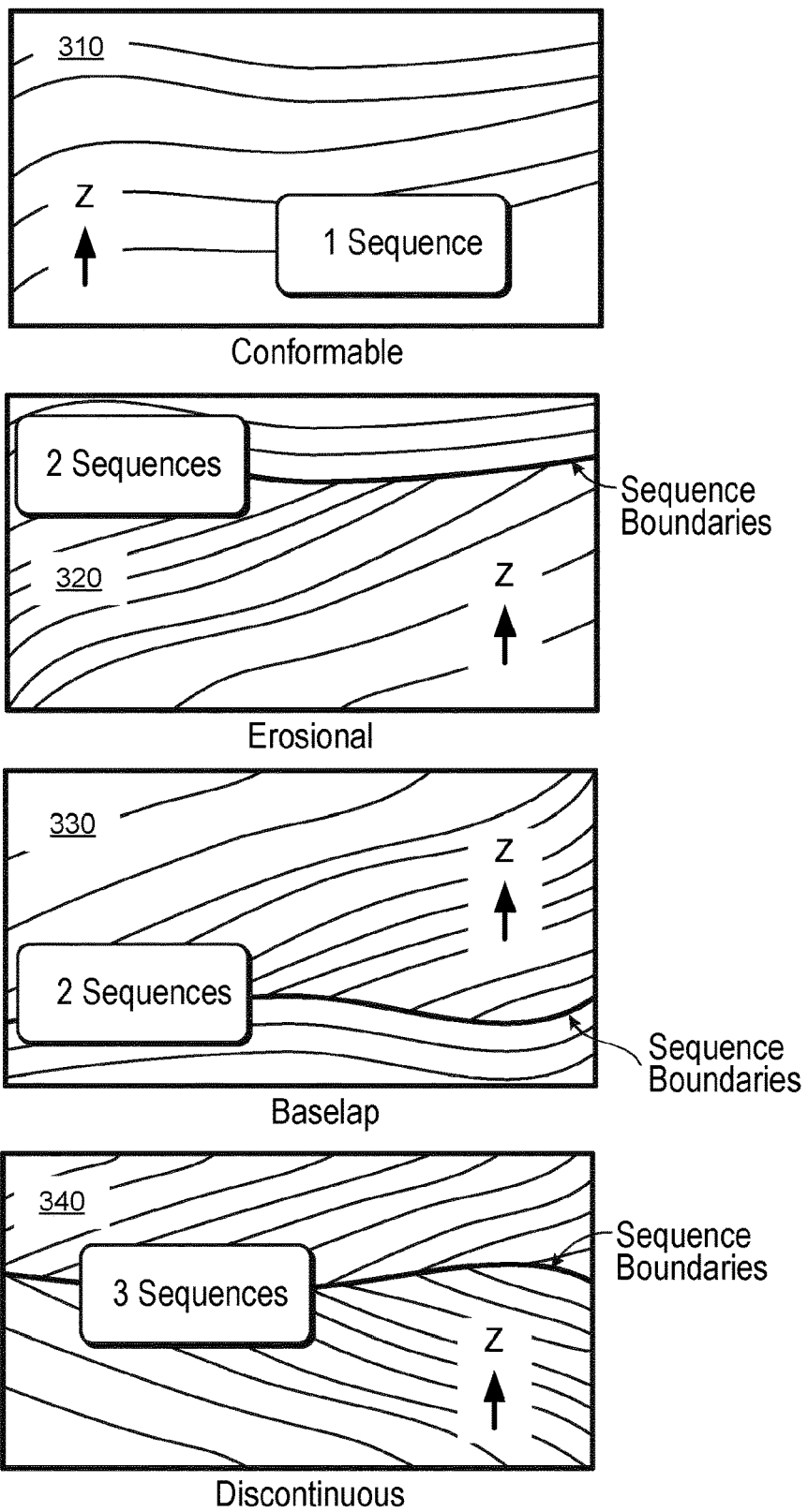
FIG. 3 illustrates examples of conformities and unconformities.

FIG. 3 shows examples of formations that include one or more sequences, for example, sequences of sedimentary structures (e.g., strata, horizons, etc.) occurring in sedimentary rocks. As shown in FIG. 3, the formation 310 includes a single sequence, the formations 320 and 330 each include two sequences and the formation 340 includes three sequences, the middle sequence being collapsed into a single discontinuity surface.

As an example, a conformable horizon may be a horizon between a lower horizon and an upper horizon where the horizons have undergone a relatively common geologic history, for example, being deposited in succession (e.g., continuous in time). Referring to the formation 310, the horizons do not intersect one another and each of the horizons may be considered conformable to adjacent horizons (e.g., lower and upper or older and younger).

As an example, erosion may act to denude rock, for example, as a result of physical, chemical and/or biological breakdown and/or transportation. Erosion may occur, for example, as material (e.g., weathered from rock, etc.) is transported by fluids, solids (e.g., wind, water or ice) or mass-wasting (e.g., as in rock falls and landslides). Referring to the formation 320, of the two sequences shown, the lower sequence may have been eroded and the upper sequence deposited on top of the eroded lower sequence. In such an example, the boundary between the two sequences may be referred to as an erosion; noting that it is conformable to the upper, younger sequence. As an example, erosion may act to "truncate" a sequence of horizons and to form surface upon which subsequent material may be deposited (e.g., optionally in a conformable manner).

As an example, a baselap may be a type of feature in a formation, for example, such as a downlap or an onlap. As an example, a downlap may be a termination of more steeply dipping overlying strata against a surface or underlying strata that have lower apparent dips. For example, a downlap may be seen at the base of prograding clinoforms and may represent progradation of a basin margin. As to an onlap, for example, it may be a termination of shallowly dipping, younger strata against more steeply dipping, older strata (e.g., sequence stratigraphy that may occur during periods of transgression). Referring to the formation 230, given the indicated direction "z" as depth, the type of baselap shown may be considered as a downlap (e.g., lower strata having lower apparent dips). In such an example, the baselap boundary is conformable to immediately older horizons (lower sequence).

As to the formation 340, it includes three sequences and may be referred to as a discontinuity as the boundary is neither conformable to older horizons nor to younger ones. In the examples of FIG. 3, erosions, baselaps and discontinuities may be referred to as unconformities or non-conformable horizons (e.g., or surfaces, layers, etc.).

Figure 4:
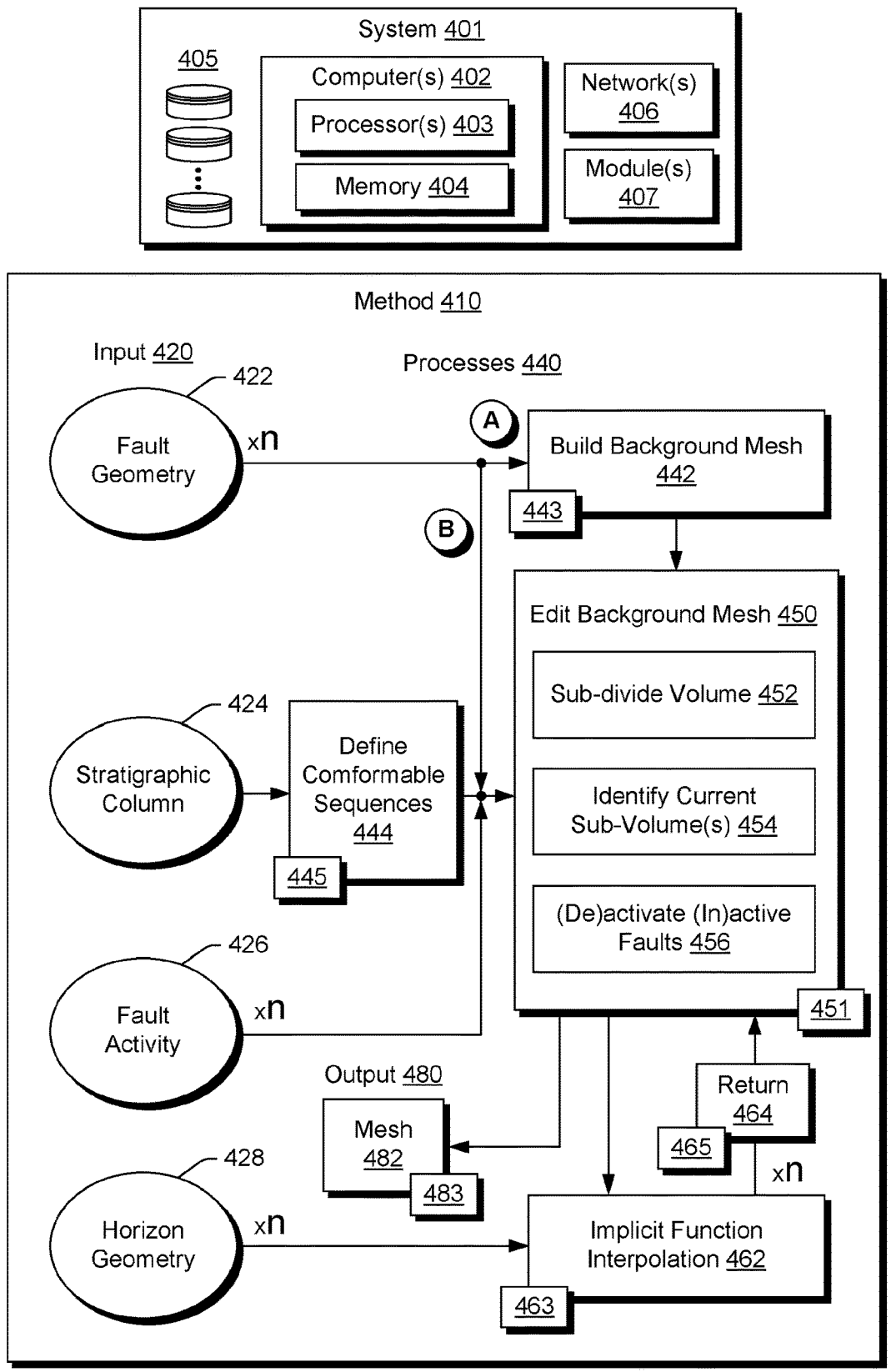
FIG. 4 illustrates an example of a system and an example of a method.

FIG. 4 shows an example of a system 401 and a method 410. As shown in FIG. 4, the system 401 includes one or more computers 402, one or more storage devices 405, one or more networks 406 and one or more modules 407. As to the one or more computers 402, each computer may include one or more processors (e.g., or processing cores) 403 and memory 404 for storing instructions (e.g., modules), for example, executable by at least one of the one or more processors. As an example, a computer may include one or more network interfaces (e.g., wired or wireless), one or more graphics cards, a display interface (e.g., wired or wireless), etc. As an example, data may be provided in the storage device(s) 405 where the computer(s) 402 may access the data via the network(s) 406 and process the data via the module(s) 407, for example, as stored in the memory 404 and executed by the processor(s) 403.

As an example, a system may include receiving information. For example, a component of a system may include receiving information via a bus, a storage device, a network interface, etc. As an example, where instructions execute via a processor, the processor may receive information. For example, a processor may receive data. As an example, data may correspond to measured data, synthetic data, constructed data, etc. As an example, data may be attribute data. As an example, data may describe a model. As an example, data may describe a mesh. As an example, data may define an implicit function. As an example, data may define a stratigraphic function. As an example, a processor may provide information by receiving the information, by generating the information, etc.

As shown in FIG. 4, the method 410 includes input 420, processes 440 and output 480. As to the input 420, the method 410 may receive, for example, fault geometry input per an input block 422, stratigraphic column input per an input block 424, fault activity input per an input block 426 and horizon geometry input per an input block 428. As indicated, the processes 440 can include a build block 442 for building a background mesh, a definition block 444 for defining conformable sequences, an edit block 450 for performing one or more edit procedures per blocks 452, 454 and 456, an implicit function interpolation block 462 for interpolating an implicit function (e.g., or implicit functions) and a return block 464, which may return to the edit block 450, for example, after performing one or more interpolations per the implicit function interpolation block 462. As an example, the method 410 can include outputting a mesh as output 480 per a mesh output block 482, for example, where the output mesh may be suitable for one or more purposes.

As an example, the method 410 may include receiving a background mesh (e.g., built per the mesh block 442), receiving one or more conformable sequences (e.g., defined per the definition block 444) and editing the received background mesh using the received one or more conformable sequences (e.g., per the edit block 450) to provide an edited mesh. In such an example, the method 410 may include populating the edited mesh with values of an implicit function via an interpolation procedure (e.g., per the implicit function interpolation block 462) based at least in part on receiving, as input, horizon geometry (e.g., per the input block 428). In such an example, the method 410 may include outputting a mesh that is or may be "split" into multiple volumes along one or more unconformities (see, e.g., the formations 320, 330 and 340 of FIG. 3). For example, the method 410 may include outputting a mesh (e.g., per the mesh output block 482). In turn, a model of a geologic environment may be constructed at least in part using such a mesh.

As an example, a method may be implemented that can create a model (e.g., a multidimensional spatial model) of a faulted stratigraphic sequence (e.g., faulted geological layers). Such a method may include creating a model that represents one or more unconformities, for example, where an unconformity may be a domain boundary that separates younger rock from older rock (e.g., consider a gap in a geological time record). As an example, a method may create a model for use in modeling structures, phenomena, etc. in one or more dimensions. As an example, a model may be suited for modeling structures, phenomena, etc. with respect to time (e.g., a time dimension, whether forward, backward or both). As an example, a method that includes performing one or more numerical techniques may use a model, for example, to discretize a geologic environment (e.g., in one or more dimensions) and to formulate sets of equations that correspond to at least a portion of the discretized geologic environment. For example, a model may include nodes, a grid defined by nodes, cells (e.g., consider two-dimensional cells and three-dimensional cells), etc.

As an example, a method such as the method 410 may account for real geometrical input, for example, without necessarily having to model or interpret eroded or non-deposited parts of layers, or eroded parts of faults. As an example, a method may include constructing a geological model in the form of a mesh or of a set of meshes, such that the model is watertight, for example, where one or more faults, conformable layers and unconformities may be represented by meshes (e.g., optionally resulting from splitting of a mesh) that have contacts (i.e. no geometrical gaps or overlaps) with each other. As an example, a method may include accounting for fault activity, for example, where faults may be eroded by some conformable sequences while introducing a discontinuity in younger sequences, in a geologically consistent manner. As an example, a method may be tolerant to geometrical inaccuracies in the interpretation of such eroded faults, and may produce geologically meaningful results even if the fault interpretation is going past the erosion surface that should be truncating it.

As an example, a method may include modeling simultaneously (e.g., representing by a single implicit function on a volume mesh), horizons that belong to a particular conformal sequence (e.g., including one or more sequence boundaries where one or more may be an unconformity). For example, referring to the example formations 320, 330 and 340 of FIG. 3, a method may include modeling successively each of the conformable sequences subject to a sequence boundary (e.g., or boundaries) that may be an unconformity (e.g., an erosion, a baselap, a discontinuity, etc.), for example, by representing conformal sequences by one or several implicit functions defined on separate (e.g., topologically disconnected) elements of a background mesh. Such an approach may provide for reliable and accurate modeling of conformable or non-conformable horizons, for example, which may at times be defined by sparse data (e.g., consider well tops data).

Referring again to the method 410 of FIG. 4, examples of Options A and B are shown with respect to the fault geometry input block 422. For Option A, the input block 422 may provide input to the build block 442 for use in building a background mesh; whereas, for Option B, the fault geometry input block 422 may provide input to the edit block 450. For Option A, as an example, a background mesh may be built by the build block 442 such that the background mesh is constrained, at least in part, by geometry of a fault or faults. For Option B, as an example, a background mesh may be unconstrained by geometry of a fault or faults while editing per the edit block 450 takes into account geometry of a fault or faults.

The method 410 of FIG. 4 may be referred to as an implicit modeling technique as it includes using one or more implicit functions. As an example, such a method can include representing geological horizons in three-dimensions using specific iso-surfaces of a scalar property field (e.g., an implicit function) defined on a three-dimensional background mesh. In such an example, continuity of the scalar field property may be governed by continuity of the background mesh.

As an example, a method can include building a background mesh suitable for interpolating an implicit function, identifying a set of conformable sequences from the geological type of stratigraphic horizons, and editing the background mesh on which the interpolation is performed for processing of a first conformable sequence or between processing of two successive conformable sequences. As to such editing, it may include creating sub-volumes in the background mesh by subdividing it by previously interpolated sequence boundaries (see, e.g., the subdivision block 452 of FIG. 4), identifying sub-volumes corresponding to a "current" conformable sequence (see, e.g., the identification block 454 of FIG. 4) and restricting further interpolation and iso-surface extraction processes to the identified sub-volumes and, for example, managing fault activity in one or more of the identified sub-volumes (see, e.g., the (de)activate (in)activate block 456 of FIG. 4), for example, by introducing and/or removing one or more internal discontinuities in the background mesh.

Figure 7:
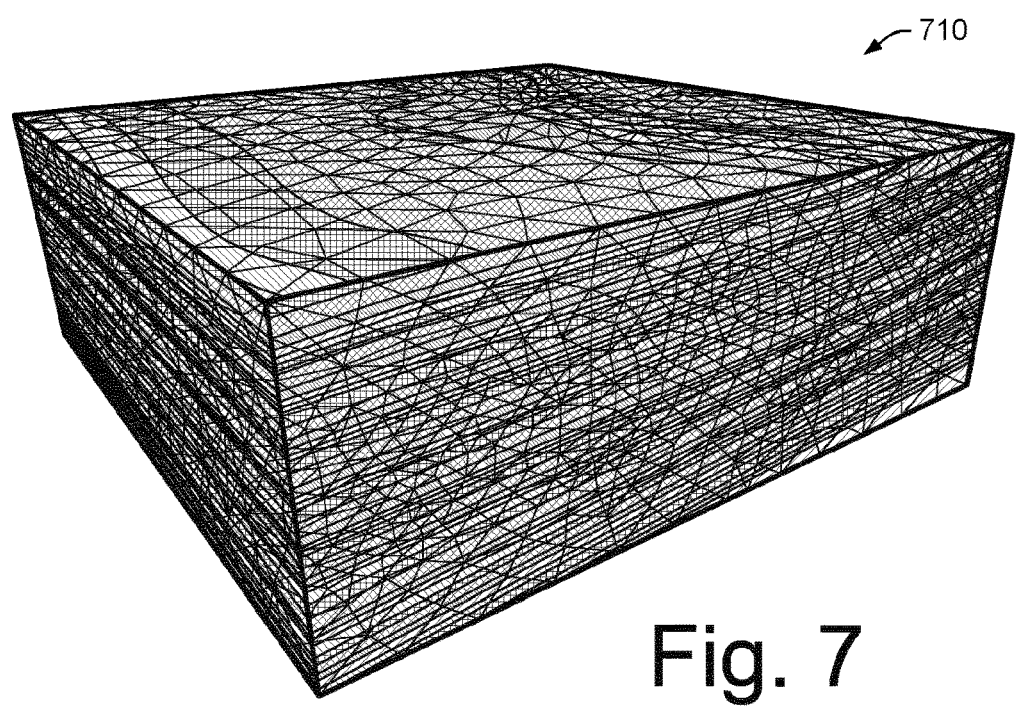
FIG. 7 illustrates an example of a mesh in a volume of interest.
Figure 8:
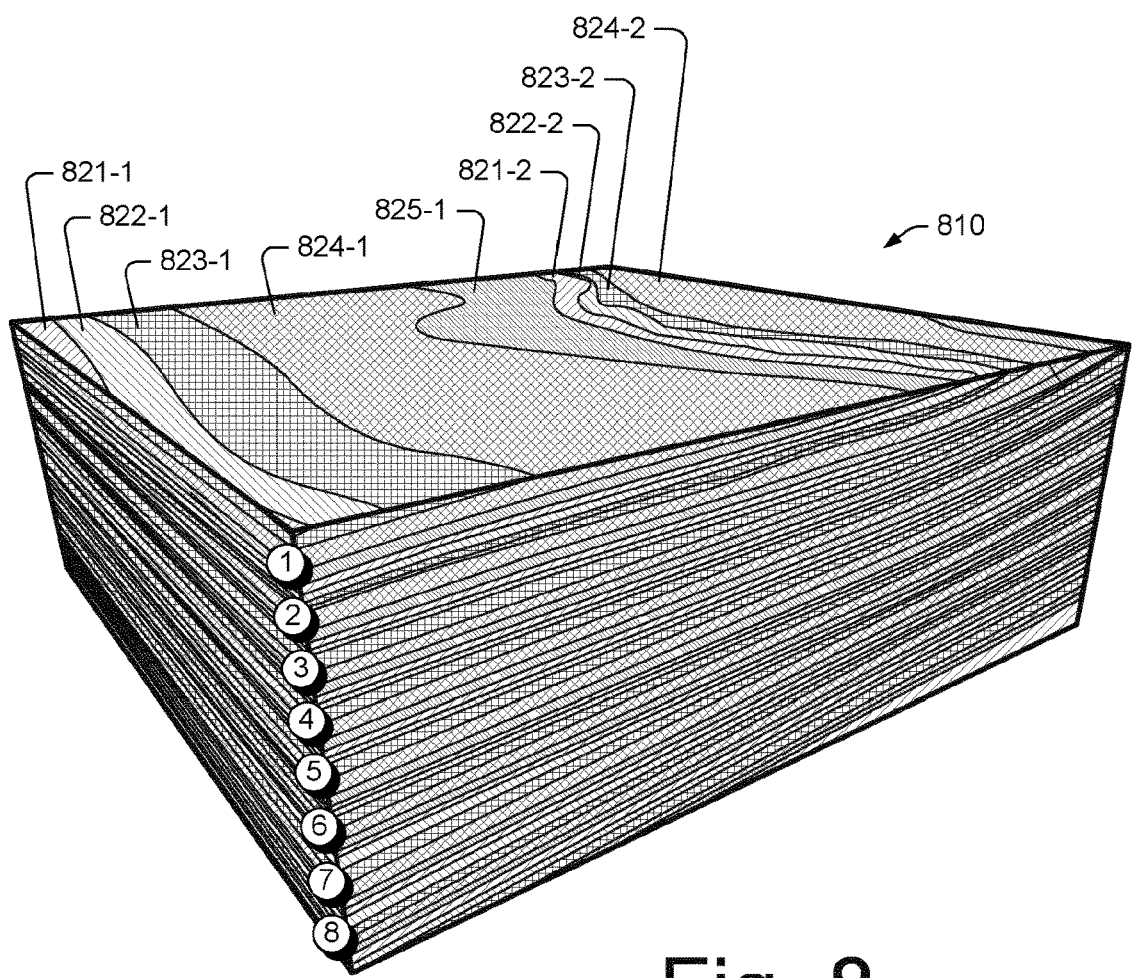
FIG. 8 illustrates an example of volume attribute values in a volume of interest.

As to processing one or more implicit functions, a method can include interpolating one or more implicit functions on a "conformable sequence per conformable sequence" basis, for example, optionally one conformable sequence at a time (see, e.g., the example meshes of FIGS. 7 and 8).

In the example of FIG. 4, the method 410 includes a return block 464 whereby results from the implicit function interpolation block 462 may be provided to the edit block 450 to perform one or more additional edits to the edited background mesh. As an example, a loop may exist between the edit block 450 and the implicit function interpolation block 462, for example, where various actions may be repeated to process a stratigraphic pile (e.g., for modeling the stratigraphic pile). As an example, an iso-value of a previously interpolated implicit function that corresponds to an unconformity (e.g., a sequence boundary) may be used as input to sub-divide block 452, As mentioned, the method 410 can include output 480, for example, which may output a mesh (e.g., or meshes) per the mesh output block 482. As an example, a mesh (e.g., or meshes) may be considered a model of a geologic environment.

The method 410 is shown in FIG. 4 in association with various computer-readable media (CRM) blocks 443, 445, 451, 463, 465 and 483. Such blocks generally include instructions suitable for execution by one or more processors (or cores) to instruct a computing device or system to perform one or more actions. While various blocks are shown, a single medium may be configured with instructions to allow for, at least in part, performance of various actions of the method 410. As an example, a computer-readable medium (CRM) may be a computer-readable storage medium. As an example, the blocks 443, 445, 451, 463, 465 and 483 may be provided as one or more modules, for example, such as the one or more modules 407 of the system 401 of FIG. 4.

Figure 5:
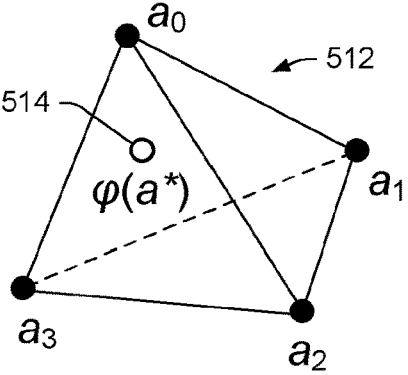
FIG. 5 illustrates examples of formulations.

FIG. 5 shows an example of a control point constraints formulation 510 with respect to a tetrahedral cell 512 (e.g., a volumetric element) that includes a control point 514 and an example of a linear system formulation 530. As an example, an implicit function may be a scalar field. As an example, an implicit function may be represented as a property or an attribute, for example, for a volume (e.g., a volume of interest). As an example, the aforementioned PETREL® framework may include a volume attribute that includes spatially defined values that represent values of an implicit function.

As an example, a function "F" may be defined for coordinates (x, y, z) and equated with an implicit function denoted φ. As to constraint values, the function F may be such that each input horizon surface "I" corresponds to a known constant value $h_i$ of φ. For example, FIG. 5 shows nodes (e.g., vertices) of the cell 512 as including $a_0$, $a_1$, $a_2$ and $a_3$ as well as corresponding values of φ (see column vector). As to the values $h_i$ of φ, if a horizon I is younger than horizon J, then $h_i$>$h_j$ and, if one denotes T_ij* as an average thickness between horizons I and J, then $(h_k-h_i)/(h_j-h_i)$ ~T_ik*/Tij*, for which a method can include estimating values of T_ij* before an interpolation is performed. Note that the method may accept lower values $h_i$ of φ for younger horizons, for example, a constraint being that, within each conformal sequence, the values $h_i$ of φ vary monotonously with respect to the age of the horizons. As an example, this may be a single constraint.

As to interpolation of "F", as an example, φ may be interpolated on nodes of a background mesh (e.g., a triangulated surface in 2D, a tetrahedral mesh in 3D, a regular structured grid, quad/octrees, etc.) according to several constraints that may be honored in a least squares sense. In such an example, as the background mesh may be discontinuous along faults, interpolation may be discontinuous as well; noting that "regularization constraints" may be included, for example, for constraining smoothness of interpolated values.

As an example, a method can include interpolating an implicit function on a vertical (2D) cross-section through a model where, for example, the interpolating includes constraining the interpolation by dip information. For example, consider a method that includes constraining an interpolation by apparent dip of one or more horizons of a section (e.g., seismic horizons of a 2D cross-section).

As an example, a method may include using fuzzy control point constraints. For example, consider a location of interpretation points, $h_i$ of φ (see, e.g. point a* in FIG. 5). As an example, an interpretation point may be located at a location other than that of a node of a mesh onto which an interpolation is performed, for example, as a numerical constraint may be expressed as a linear combination of values of φ at nodes of a mesh element (e.g. a tetrahedron, tetrahedral cell, etc.) that includes the interpretation point (e.g., coefficients of a sum being barycentric coordinates of the interpretation point within the element or cell).

For example, for an interpretation point p of a horizon I located inside a tetrahedron which includes vertices are $a_0$, $a_1$, $a_2$ and $a_3$ and which barycentric coordinates are $b_0$, $b_1$, $b_2$ and $b_3$ (e.g., such that the sum of the barycentric coordinates is approximately equal to 1) in the tetrahedron, an equation may be formulated as follows:

$$b_0\varphi(a_0)+b_1\varphi(a_1)+b_2\varphi(a_2)+b_3\varphi(a_3)=h_i$$

where unknowns in the equation are $\varphi(a_0)$, $\varphi(a_1)$, $\varphi(a_2)$ and $\varphi(a_3)$. For example, refer to the control point φ(a*), labeled 514 in the cell 512 of the control point constraints formulation 510 of FIG. 5, with corresponding coordinates (x*, y*,z*); noting a matrix "M" for coordinates of the nodes or vertices for $a_0$, $a_1$, $a_2$ and $a_3$, (e.g., $x_0$, $y_0$, $z_0$ to $x_3$, $y_3$, $z_3$).

As an example, the number of such constraints of the foregoing type may be based on the number of interpretation points where, for example, interpretation points may be decimated interpretation for improving performance.

As mentioned, a process can include various regularization constraints, for example, for constraining smoothness of interpolated values, of various orders (e.g., constraining smoothness of φ or of its gradient ∇φ), which may be combined through a weighted least squares scheme.

As an example, a method can include constraining the gradient ∇φ in a mesh element (e.g. a tetrahedron, a tetrahedral cell, etc.) to take a (weighted) arithmetic average of values of the gradients of φ with respect to its (topological) neighbors. As an example, one or more weighting schemes may be applied (e.g. by volume of an element) and one or more definitions of a topological neighborhood (e.g., by face adjacency) may be considered. As an example, two geometrically "touching" mesh elements that are located on different sides of a fault may be deemed not topological neighbors, for example, as a mesh may be "unsewn" along fault surfaces (e.g., to define a set of elements or a mesh on one side of the fault and another set of elements or a mesh on the other side of the fault).

As an example, within a mesh, if one considers a mesh element $m_i$ that has n neighbors $m_j$ (e.g., for a tetrahedron), one may formulate an equation of the regularization constraint as follows:

$$\nabla\varphi(m_i) = \frac{1}{n}\sum_{j=1}^{n}\nabla\varphi(m_j)$$

In such an example of a regularization constraint, where solutions for which iso-values of the implicit function would form a "flat layer cake" or "nesting balls" geometries may be considered "perfectly smooth" (i.e. not violating the regularization constraint), it may be that a first one is targeted.

As an example, one or more constraints may be incorporated into a system in linear form. For example, hard constraints may be provided on nodes of a mesh (e.g., a control node). In such an example, data may be from force values at the location of well tops. As an example, a control gradient, or control gradient orientation, approach may be implemented to impose dip constraints.

Referring again to FIG. 5, the example linear system formulation 530 includes various types of constraints. For example, a formulation may include harmonic equation constraints, control point equation constraints (see, e.g., the control point constraints formulation 510), gradient equation constraints, constant gradient equation constraints, etc. As shown in FIG. 5, a matrix A may include a column for each node and a row for each constraint. Such a matrix may be multiplied by a column vector such as the column vector $\varphi(a_i)$ (e.g., or φ), for example, where the index "i" corresponds to a number of nodes, vertices, etc. for a mesh (e.g., a double index may be used, for example, $a_{ij}$, where j represents an element or cell index). As shown in the example of FIG. 5, the product of A and the vector φ may be equated to a column vector F (e.g., including non-zero entries where appropriate, for example, consider $\phi_{control\ point}$ and $\phi_{gradient}$).

FIG. 6 shows a block diagram of an example of a method 610 that includes an input block 620 and output block 680, for example, to output an implicit function equated to a stratigraphic property per a block 682. As to the input block 620, it may include a fault surfaces input block 622 and a horizon points input block 624. As shown in the example of FIG. 6, the input block 620 may provide input to a thickness estimation block 630, a layer block 640 and a background mesh block 652.

As to the layer block 640, it can include a thickness values block 642 for determining or receiving thickness values (e.g., based on or from the thickness estimation block 630) and a computation block 644 for computing control point values (see, e.g., the formulations 510 and 530 of FIG. 5). As shown, the layer block 640 can output control points to a control points block 662, which may be defined with respect to a mesh provided by the background mesh block 652. As an example, the control points of the control points block 662 may account for one or more regularization constraints per a regularization constraint block 654.

As an example, given control point values for layers definable with respect to a mesh and subject to one or more constraints, a method can include calculating values of an implicit function (e.g., or implicit functions). As shown in the example of FIG. 6, an implicit function calculation block 662 can receive control points and one or more constraints defined with respect to a mesh (e.g., elements, cells, nodes, vertices, etc.) and, in turn, calculate values for one or more implicit functions.

As to the output block 680, given calculated values for one or more implicit functions, these may be associated with, for example, a stratigraphic property per the block 682. As an example, one or more iso-surfaces may be extracted based at least in part on the values of the stratigraphic property per an iso-surface extraction block 684, for example, where one or more of the extracted iso-surfaces may be defined to be a horizon surface (e.g., or horizon surfaces) per a horizon surface block 686.

FIG. 6 also shows an example of a method 690 for outputting a volume based model (e.g., a model constructed from a subdivision of a volume of interest in sub-volumes representing stratigraphic layers, fault blocks or segments, etc.). As shown, the method 690 includes an input block 691 for inputting information (e.g., sealed fault framework information, horizon interpretation information, etc.), a mesh block 692 for providing or constructing a mesh, a volume attribute interpolation block 693 for interpolating values (e.g., using one or more implicit functions), an iso-surface extraction block 694 for extracting one or more iso-surfaces (e.g., based at least in part on the interpolated values), a subdivision block 695 for subdividing a meshed volume (e.g., based at least in part on one or more of the one or more extracted iso-surfaces) and an output block 696 for outputting a volume based model (e.g., based at least in part on one or more portions of a subdivided meshed volume).

As an example, the input block 691 may include one or more features of the input block 620 of the method 610, the mesh block 692 may include one or more features of the mesh block 652 of the method 610, the volume attribute interpolation block 693 may include one or more features of the implicit function calculation block 664 and/or the stratigraphic property block 682 of the method 610, the iso-surface extraction block 694 may include one or more features of the iso-surface extraction block 684 of the method 610, the subdivision block 695 may include subdividing a meshed volume using one or more horizon surfaces per the horizon surfaces block 686 of the method 610 and the output block 696 may include outputting a volume based model based at least in part on one or more outputs of the output block 680 of the method 610.

As explained with respect to the method 410 of FIG. 4, an implicit function may be provided for performing, for example, interpolation. As an example, an implicit modeling approach can include representing surfaces as iso-values of a volume attribute (e.g., of an implicit function). As an example, such a volume attribute may be referred to as being a "thickness proportion" (e.g., volumetrically filling in space). For example, an implicit function may correspond to the stratigraphic age of formations and, for example, such an implicit function may be embedded and interpolated in a volumetrically filling tetrahedral mesh (e.g., structured, unstructured, etc.).

As an example, a method can include building a tetrahedral mesh for carrying and interpolating an implicit function. As an example, a 3D boundary-constrained Delaunay mesh generator may be implemented, for example, with constraints such as constraints based on faults affecting considered horizons where such faults may be accounted for as internal boundaries during mesh generation, for example, where some border faces of tetrahedra may match fault geometries in a resulting mesh. As an implicit function may be defined and interpolated on nodes of a tetrahedral mesh, density of the mesh, and therefore the spatial resolution of the implicit function, may be controlled, for example, to include a higher density within a shell at, proximate to or around various data and/or faults (e.g., to maximize degree of freedom of an interpolation at or near various data and/or faults). As an example, a mesh adaptation process may include producing tetrahedra that have a vertical resolution higher than their areal resolution (e.g., to better capture thickness variations in layering). As an example, a resulting mesh (e.g., a built mesh) may be unstructured.

As an example, a method can include interpolating values of an implicit function on nodes of a tetrahedral mesh. As an example, an interpolation process may include using a linear least squares formulation, which may tend to minimize misfit between interpretation data and interpolated surfaces and to minimize variations of dip and thickness of layers.

As an example, a method can include generating surfaces representing individual implicitly modeled horizons. In such an example, as the specific value of the implicit function associated to each of the individual horizons may be known, a method may include using an iso-surfacing algorithm. As an example, resolution of a resulting surface or surfaces may be higher or approximately equal to a local resolution of a tetrahedral mesh around sample points (e.g., which may be user-controllable).

As an example, a method may include a volume based modeling approach that generates a consistent zone model (e.g., a model of interpreted geological layers). For example, such a zone model may include an individual geological layer that may be seen as an interval of values of an implicit function. In such an example, given its value of the implicit function, a method may determine to which layer an arbitrary point belongs, in particular where such arbitrary points correspond to nodes of a mesh supporting the implicit function.

As an example, edges of a tetrahedral mesh may intersect limits of geological layers. In such an example, construction of such intersection points may have been computed where they correspond to nodes of triangulated surfaces representing horizons. Accordingly, zones may be built by cutting edges of the tetrahedral mesh by some iso-surfaces of the implicit function.

As an example, a method can include cutting a volume to produce zones that are sets of tetrahedra. As an example, a method can include cutting volume borders to produce zones that are sets of triangulated patches. As to the latter, it may include cutting volume borders by iso-contours. As noted, one or more implicit functions may be formulated for determination of iso-surfaces and/or iso-contours that do not intersect one another other.

As an example, a volume based modeling approach may be less sensitive to complexity of a fault network and may provide conformable horizons belonging to a common conformable sequence (e.g., which may be modeled simultaneously). As to the latter, by using an implicit approach (e.g., by representing sets of conformable horizons by several iso-values of a common implicit attribute), the approach may avoid crossing of conformable horizons.

As an example, a volume based modeling approach may provide for conformable horizons that constrain geometry of other conformable horizons that belong to a common sequence, which itself may be constrained by geometry. As an example, a volume based modeling approach may be applied in scenarios where data are sparse, for example, consider data from well tops, 2D sections, etc. As an example, one or more surfaces may be modeled using seismic data and, for example, globally adjusted using well top data.

As an example, a volume based modeling approach may include outputting geometry of a horizon as well as volume attribute values, which may be defined within a volume of interest and, for example, represent a stratigraphic age, or relative chronostratigraphic age, of a formation (or formations).

As an example, the method 410 of FIG. 4 may include outputting one or more models (e.g., a mesh or meshes, etc.) that account for various features of a geologic environment, for example, where the output model or models is volume filling (e.g., "watertight" or "sealed").

As an example, a method may be implemented to create a reservoir model on a "conformable sequence per conformable sequence" basis, for example, where surfaces belonging to a common conformable sequence may be interpolated simultaneously. As an example, a method can include iteratively editing topology of a volume mesh, for example, to control extent of the volume in which an interpolation is performed and continuity of an interpolated implicit function. As an example, a method may include producing layering that is consistent with a geological style of deposition in one or more eroded areas.

As an example, a method can include building a background mesh, for example, where the background volume mesh covers a volume of interest (VOI), which itself may be of a size sufficient to include horizons to be modeled.

FIG. 7 shows an example of a mesh 710 that may be volumetrically filled by, for example, tetrahedra. In the example of FIG. 7, the mesh 710 is also shown along with volume attribute values. In the example of FIG. 7, the volume attribute values may be displayed or represented with respect to a periodic color scale, for example, where the volume attribute or "property" may be monotonously increasing (e.g., corresponding to values of a monotonic implicit function). For example, each "period" of the periodic scale may correspond to a layer in a series of layers defined by input horizons. In such an example, an individual horizon may be conformable to another individual horizon within a common sequence.

FIG. 8 shows a volume 810 that corresponds to the mesh 710 of FIG. 7, however, without lines indicating mesh elements (e.g., mesh cells, etc.). In the example of FIG. 8, eight portions (portions 1 to 8) are shown as an example for purposes of explanation. For example, within these portions, a periodic scale may be repeated as indicated by black and white hatchings: 821-1, 822-1, 823-1, 824-1, 825-1, 821-2, 822-2, 822-3, 824-2, etc. As mentioned, the scale may represent values of an implicit function. As an example, a scale may be illustrated using one or more colors, shading, rainbow patterns, etc.

Referring again to FIG. 7, the tetrahedral background mesh 710 also shows an implicit function represented by a periodic scale (e.g., whether black and white, color, etc.) that may be interpolated within the background mesh. As mentioned, FIG. 8 shows the volume 810 without the mesh lines to more clearly illustrate an example of a periodic scale for an implicit function.

As an example, a method may include building a mesh that includes subsets of its facets that match (e.g., in a general sense) elements of the mesh representing one or more faults. In such an example, the facets may be approximating, in the background mesh, geometry of a fault network. As an example, a mesh may include elements with shape and size that are specified to be suitable for an interpolation process (e.g., shape, size, etc. may be specified depending on one or more characteristics of an interpolation process).

As an example, a mesh may be considered an initial mesh (e.g., or other early stage mesh) that may not include one or more internal borders, for example, that represent one or more discontinuities.

As an example, a method can include identifying one or more conformable sequences. In such an example, an identification process may include identifying a set of conformable sequences from a geological type of stratigraphic horizons, for example, provided by an operator of the system. As an example, consider one or more of the definitions provided with respect to FIG. 3 where: (a) an erosion may be an unconformity that is conformable to one or more horizons immediately younger (e.g., without gaps in the geological record) and not conformable to one or more older horizons; (b) a baselap may be an unconformity that is conformable to one or more horizons immediately older (e.g., without gaps in the geological record) and not conformable to one or more younger horizons; and (c) a discontinuity may be an unconformity that is neither conformable to one or more older horizons nor to one or more younger ones. As an example, a conformable horizon may be assumed to be conformable to at least an adjacent younger horizon and at least an adjacent older horizon.

Provided with definitions for a given stratigraphic sequence that includes conformable horizons and unconformities, it may be possible to divide the sequence into subsets of conformable sequences, for example, where an individual horizon (e.g., conformable or unconformity) belongs to a single conformable sequence. For example, consider the following rules: (a) an erosion is the oldest horizon to be modeled in the conformable sequence it belongs to; (b) a baselap is the youngest horizon to be modeled in the conformable sequence it belongs to; and (c) a discontinuity is modeled alone in its "own" conformable sequence, which may be, in such a case, a conformable sequence that is degenerated to a single surface.

Through use of such rules, a produced conformable sequence may include a set of horizons that are conformable to one another, for example, meaning that they do not have any contact with one another and do not intersect one another. In such an example, an individual conformable sequence may be modeled with a single implicit function. As an example, a one-to-one correspondence may exist between conformable sequences and implicit functions.

As an example, a method can include editing a mesh (e.g., a background mesh). For example, an editing process may prepare a mesh for interpolation of an implicit function for modeling a given conformable sequence in the mesh. As an example, consider a sub-volume process that can create sub-volumes within a meshed volume of interest (VOI). As an example, sub-volumes may be first created from sub-volumes of a background mesh used to model a prior conformable sequence; noting that where a conformable sequence is a first conformable sequence, such a process may, by definition, not have a prior conformable sequence and may be created directly. As an example, a sub-volume process may include cutting sub-volumes according to one or more unconformities that may bound a conformable sequence previously modeled.

A sub-volume process may be performed, for example, in a manner that avoids numerical instabilities where a feature may be an iso-surface of a scalar property field defined within considered sub-volumes. In such an example, geometrical intersections between mesh elements of the feature (e.g., which may be triangles or other shaped faces) and the mesh elements of the sub-volumes (e.g., which may be tetrahedra or other volumes), may be, for example, one of two kinds: (i) a node of a triangle lying on an edge of a tetrahedron; or (ii) a node of a triangle being collocated with a node of a tetrahedron. Such an approach may, for example, facilitate computation of one or more geometrical intersections.

As an example, an identification process may include identifying one or more sub-volumes as corresponding to a conformable sequence. For example, where a previously modeled unconformity is modeled through a volume of interest and includes a maximum areal extension, it may intersect the volume of interest in a manner that divides the volume of interest into sub-volumes such as, for example, two subsets of new sub-volumes. As an example, one subset of new sub-volumes may be for a sequence older than an unconformity while another subset of new sub-volumes may be for a sequence younger than the unconformity.

As an example, a method may include computing relative ages by taking an average value of an implicit function having been used to model an unconformity in a sub-volume and comparing it with a value of an iso-surface that represents the unconformity. For example, an iso-surface may be defined along a scale that corresponds to age. As an example, depending on order with which conformable sequences are modeled (e.g., from younger to older or from older to younger), one of two subsets of new sub-volumes may be selected and considered for processing a next conformable sequence. As an example, a periodic scale may be implemented to facilitate visualization of an implicit function (e.g. with respect to one or more features in a sequence).

As to interpolation of an implicit function corresponding to a conformable sequence, as an example, its distribution may be discontinuous across one or more internal borders of a background mesh and continuous elsewhere (see, e.g., FIGS. 7 and 8). As an example, interpolation may be performed in one or more sub-volumes of a background mesh that have been created and identified as corresponding to a "current" conformable sequence. As an example, data points that included in such one or more sub-volumes may be taken into account to constrain an interpolation of an implicit function. As an example, once an interpolation process has been performed to provide values for an implicit function, implicit horizons of the "current" conformable sequence may be transformed into explicit surfaces using one or more iso-surfacing algorithms.

Figure 9:
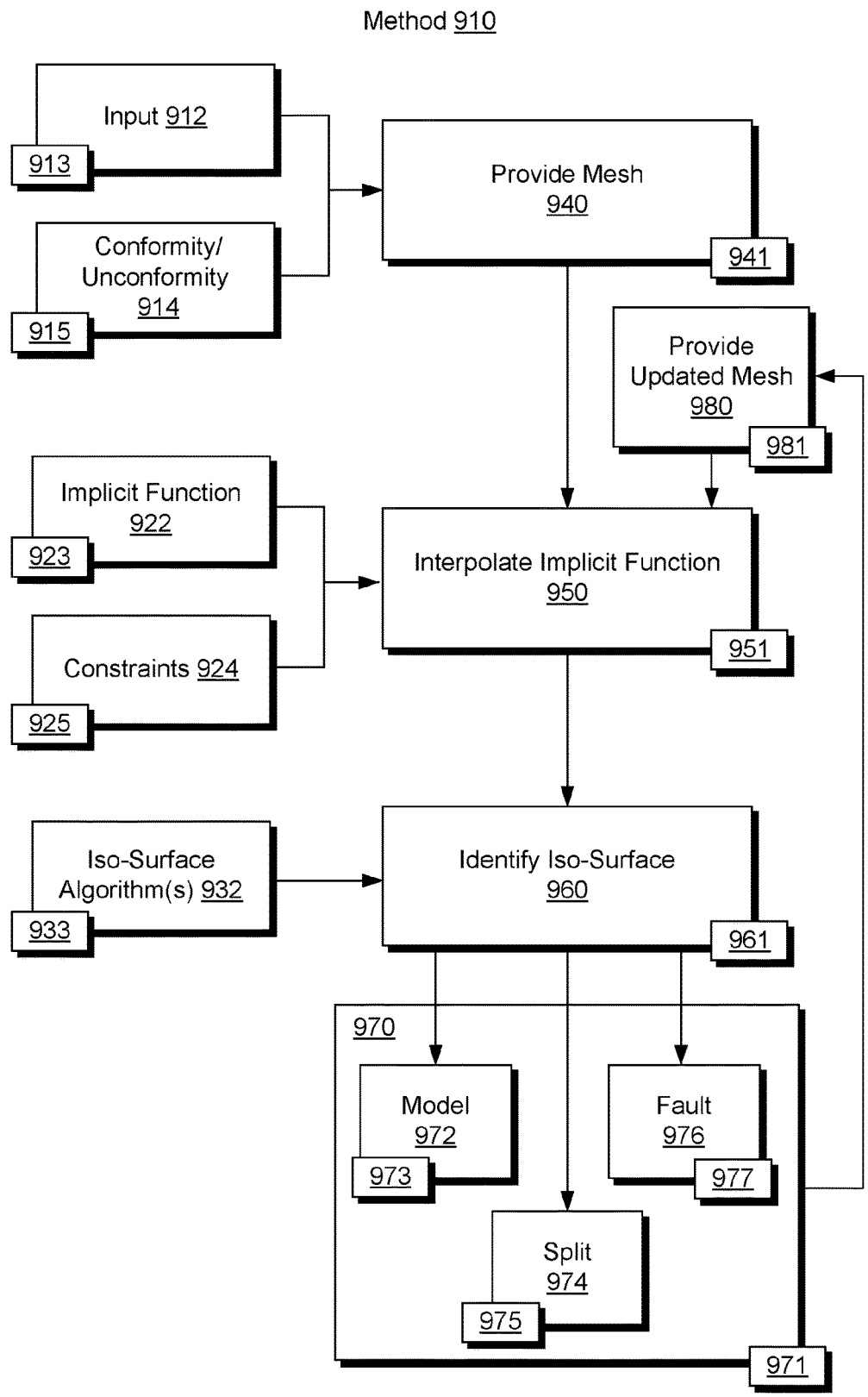
FIG. 9 illustrates an example of a method.

FIG. 9 shows an example of a method 910 that includes a provision block 940 for providing a mesh of a geologic environment that includes conformable sequences and an unconformity (or unconformities); an interpolation block 950 for interpolating an implicit function defined with respect to the mesh to provide values for the implicit function; and an identification block 960 for identifying an iso-surface based on a portion of the values where the iso-surface represents the unconformity, for example, as residing between two of the conformable sequences.

As an example, the provision block 940 may include providing the mesh, receiving the mesh, building the mesh, editing a mesh, etc. based at least in part on receiving input from an input block 912 and input from a conformity/unconformity block 914. As an example, the conformity/unconformity block 914 may provide for defining one or more unconformities in a mesh, for example, with respect to one or more conformal sequences. As an example, the conformity/unconformity block 914 may provide data associated with an unconformity, for example, where the data is represented as values, points, etc. in a mesh.

As an example, the interpolation block 950 may include receiving one or more implicit functions per an implicit function block 922 and include receiving one or more constraints per a constraints block 924. As an example, an implicit function (or implicit functions) may be constrained by one or more constraints. As an example, where a mesh includes nodes, one or more constraints may be defined with respect to a portion of those nodes. In such an example, a linear system of equations may be formulated and solved, for example, as part of an interpolation process to provide values for an implicit function (e.g., or implicit functions).

As an example, the identification block 960 may include receiving one or more algorithms, for example, for forming iso-surfaces given values within a region or regions such as a region or regions of a mesh. For example, an algorithm may receive as input values associated with an implicit function and then define iso-surfaces for at least some of those values. As an example, an iso-surface may correspond to a horizon, an unconformity, etc. As an example, a series of iso-surfaces may correspond to a conformable sequence, for example, where the conformable sequence is at least partially bound by an unconformity, which may be represented itself as an iso-surface.

In the example of FIG. 9, the method 910 may include a block 970 for performing one or more additional actions. For example, a model block 972 may provide for outputting a model based at least in part on the identified iso-surface where such a model may be used for modeling one or more physical phenomena associated with a geologic environment (e.g., including one or more processes applied to the environment such as injection, production, etc.). As an example, the block 970 may include a splitting block 974 for splitting or sub-dividing a mesh based at least in part on an identified iso-surface. For example, where the iso-surface corresponds to an unconformity, a mesh may be split into meshes based at least in part on that iso-surface (e.g., to form a first mesh and a second mesh where the unconformity may belong to one of the first mesh or the second mesh). As an example, the block 970 may include a fault block 976 for introducing one or more faults, for activation of one or more faults, for deactivation of one or more faults, etc.

As an example, the method 910 may include a provision block 980 for providing an updated mesh (e.g., receiving an update mesh via performance of a process or processes). For example, where splitting occurs per the splitting block 974, a mesh may be updated and provided to the interpolation block 950 for further processing (e.g., the interpolation block 950 may receive an updated mesh or updates meshes). As an example, the conformity/unconformity block 914 may provide input for updating a mesh. For example, where a mesh has been split into a first mesh and a second mesh according to a first unconformity, one of the first mesh and the second mesh may be further processed, for example, using data, etc. associated with another unconformity. In the example of FIG. 9, the method 910 may perform iteratively, for example, by looping to edit a mesh (e.g., whether an initial provided mesh, a subsequent mesh resulting from splitting, etc.) and to perform interpolation of one or more implicit functions with respect to an edited mesh.

The method 910 is shown in FIG. 9 in association with various computer-readable media (CRM) blocks 913, 915, 923, 925, 933, 941, 951, 961, 971, 973, 975, 977 and 981. Such blocks generally include instructions suitable for execution by one or more processors (or cores) to instruct a computing device or system to perform one or more actions. While various blocks are shown, a single medium may be configured with instructions to allow for, at least in part, performance of various actions of the method 910. As an example, a computer-readable medium (CRM) may be a computer-readable storage medium. As an example, the blocks 913, 915, 923, 925, 933, 941, 951, 961, 971, 973, 975, 977 and 981 may be provided as one or more modules, for example, such as the one or more modules 407 of the system 401 of FIG. 4.

As an example, a method can include measurement and quantification of uncertainty associated with a spatial location of one or more faults (e.g., as in a fault network) as well as, for example, one or more relative relationships for a pair of faults, pairs of faults, etc. Such a method may enhance an ability to assess one or more reserves in a geologic environment such as, for example, hydrocarbons in one or more reservoirs of a geologic environment.

As an example, a method can include deforming at least a portion of a mesh of a model of a geologic environment. In such an example, the method can include generating a plurality of deformed meshes for a region (e.g., a portion of a larger mesh). As an example, a method can include storing one or more deformed meshes within a mesh, for example, as a region or regions of an initial mesh. As an example, a method can include associating one or more deformed meshes with respect to a mesh, for example, associated with a region or regions of an initial mesh. As an example, one or more deformed meshes may be germane to one or more statistical analyses. For example, a plurality of realizations may be based at least in part on a plurality of meshes where the plurality of meshes may be generated by deforming a portion of a base mesh within a region of interest. As an example, a number of realizations may exceed about ten to twenty and may exceed, for example, one hundred (e.g., consider one thousand realizations). As an example, a method can include selecting a number of realizations and/or a number of meshes in a manner that depends on statistics.

As an example, a method can include deforming a mesh to form a plurality of deformed meshes. Such meshes can represent different configurations for purposes of one or more statistical analyses (e.g., in one or more workflows, etc.). As an example, such meshes may form individual models that can be used in corresponding simulations where results may be output as associated with each of the models. As an example, the number of individual models may be selected based on statistics, for example, to achieve a desired level of accuracy. As the number of individual models or simulation "trials" increases, time and/or computational demands can also increase. As an example, a method can include generating a plurality of "trial" meshes in a relatively expeditious manner via a deformation approach, which may perform localized deformations as to one or more regions of interest.

As an example, a method can include receiving a base mesh that represents a geologic environment, selecting a region of the base mesh and generating deformed meshes for the region. In such an example, the generating may include locating nodes at positions determined at least in part via a parameter space that includes one or more associated parameters and one or more corresponding parameter values.

As an example, a method can include simulating physical phenomena by performing calculations for a region of a mesh. In such an example, the region may be represented by a plurality of deformed meshes where each of the deformed meshes may be considered to be a realization. As an example, a deformation field or deformation fields may be stored within a mesh, which may be, for example, an initial mesh. As an example, an approach that handles one or more regions of a mesh may be computationally less demanding than simulating physical phenomena via deformed meshes that include deformations that span an entire mesh. For example, a method can include generating a plurality of realizations via a plurality of locally contained, deformed meshes (e.g., where deformation is within a hull, a region, a vicinity, a neighborhood, etc.).

As an example, a region of interest may be associated with a fault. In such an example, a method can include deforming a mesh in a vicinity of the fault (e.g., a neighborhood about the fault) to generate a plurality of deformed meshes, which may, for example, represent a group of possible ways to represent a region that includes the fault. As an example, a method can include deforming a mesh based at least in part on a geometric shape or shapes such as, for example, an ellipsoid, a box, etc. Such a geometric shape can serve as a basis to define a local parameter space. As an example, an ellipsoid can include parameters that correspond to one or more axes, such as, one or more of an a-axis, a b-axis, and a c-axis. As to a number of parameters of a parameter space, such a number may be in a range from one to about three.

As an example, where a mesh includes nodes (e.g., defined at least in part via nodes), a shape may represent a parameter space with one or more associated parameters that can be applied to a node or nodes. For example, a node may be moved, reassigned, etc., to a position within a parameter space that is defined at least in part by at least one parameter. As an example, where a parameter space is represented by an ellipsoid, the node may be assigned a position within the parameter space to generate a deformed mesh. For example, given a base mesh, a centroid of the ellipsoid may be co-located with a node of the base mesh and, to generate a deformed mesh, the node may be repositioned to a position within a parameter space defined by the ellipsoid. Exteriorly to a region of interest, the base mesh may remain unadjusted. Thus, as an example, a base mesh can include a region within that is represented at least in part by a plurality of deformed meshes, which may be based at least in part on some amount of uncertainty as to locations of a feature or features with the region (e.g., a feature or features of a geologic environment).

As an example, one or more boundary conditions can be formulated that are imposed on at least a portion of a mesh. For example, consider imposing a boundary condition with respect to a hull boundary within a larger mesh. In such an example, the boundary condition acts to maintain the mesh outside of the hull from being deformed. Such a boundary condition may be referred to as imposing an un-touched (e.g., zero displacement) portion of a mesh that is outside of the hull. As an example, parameterization as well as hull-size definition can be specified to allow for "smooth" deformation within a hull; noting that smooth deformation is not necessarily a constraint.

As an example, deformation can pertain to where a fault is located (e.g., positioned or oriented). And, therefore, movement of a node according to a parameter space can be a node that is on the fault (e.g., a node of a triangle that is on/represents a surface of the fault). As an example, a fault can be represented by two triangular surfaces at the same location, for example, to allow for mechanical slip.

As an example, an ellipsoid may be a general ellipsoid, which may be referred to as a triaxial ellipsoid (e.g., a-axis, b-axis and c-axis, which may be referred to as semi-axes). Such an ellipsoid can be a quadratic surface, for example, specified in Cartesian coordinates by the following example equation:

$$(x^2)/(a^2)+(y^2)/(b^2)+(z^2)/(c^2)=1$$

where semi-axes are of lengths a, b, and c.

In spherical coordinates, such an equation may be rewritten, for example, as follows:

$$(r^2 \cos^2 \theta \sin^2 \phi)/(a^2)+(r^2 \sin^2 \theta \sin^2 \phi)/(b^2)+(r^2 \cos^2 \phi)/(c^2)=1$$

In such an example, where lengths of two axes of a triaxial ellipsoid are approximately the same, the shape may be referred to as a spheroid (e.g., depending on whether c<a or c>a, an oblate spheroid or prolate spheroid, respectively), and where the lengths of the three axes are approximately the same, the shape may be referred to as a sphere. As an example, lengths of one or more axes of a shape may be parameters that can include associated parameter values (e.g., numeric values).

As an example, a parameter space may be a portion of a geometric shape. For example, consider a parameter space defined by a portion of an ellipsoid. In such an example, a node of a base mesh may be co-located, for example, with a centroid of an entire ellipsoid or, for example, a centroid of the portion of the ellipsoid; or, optionally another point of such a shape.

As an example, a shape can include one or more parameters that define a parameter space and a method can include co-locating a node with respect to the shape and determining one or more positions of the node within the parameter space to generate one or more "deformed" positions of the node. In such an example, the node may be a node of a mesh and a deformed position of such a node can define at least in part a deformed mesh (e.g., a deformed version of a portion of a base mesh, etc.).

As an example, where a mesh include elements (e.g., cells), an element may include a centroid. As an example, a shape may define a parameter space within which the centroid of the element may be positioned, for example, to alter the element (e.g., to generate a deformed element).

As an example, a method can include determining one or more parameter values of one or more parameters of a shape that represents a parameter space. As an example, a parameter value may be based at least in part on an uncertainty metric. As an example, where a feature in a geologic environment is located via seismic imaging of the geologic environment, the location of the feature may be, to some amount, uncertain. Such uncertainty may be quantified in terms of distance and/or time. For example, where seismic traces are recorded with respect to time, time may be associated with depth of a feature. As an example, a method can account for at least a portion of such uncertainty via a parameter space, which may be defined via one or more of distance and time. As an example, where a frequency domain is utilized as to seismic data, some amount of uncertainty may exist that can be characterized by frequency. As an example, a method may include transforming one or more types of uncertainty from one domain to another domain, for example, a spatial domain where a parameter space may be defined with respect to spatial coordinates (e.g., Cartesian, spherical, cylindrical, etc.).

As an example, where one or more seismic attributes are determined and/or received, one or more of such attributes may include some amount of uncertainty. For example, a seismic attribute may be determined at least in part on seismic data and, optionally, one or more other types of data (e.g., well log, satellite imagery, etc.). In such an example, where such a seismic attribute is utilized, at least in part, to determine a location of a node of a mesh of a geologic environment, a parameter space may be defined that can account for at least a portion of uncertainty in how the seismic attribute is calculated (e.g., numerical uncertainty, algorithmic uncertainty, etc.) and/or in the underlying seismic data and/or other data.

As an example, a seismic interpretation workflow may be performed to determine a location of a feature such as a fault. In such an example, one or more seismic attributes may be calculated that may help to characterize the fault, for example, its position and its orientation (e.g., dip, etc.). As an example, where a fault is characterized at least in part via dip, some amount of uncertainty may be associated with the dip. In such an example, a parameter space may be defined based at least in part on the uncertainty. As an example, where dip is given by an angle, uncertainty may be given in terms of one or more deviations from that angle. As an example, a parameter space may be defined by parameter values that may be derived from an angle or angles. For example, where an ellipsoid is utilized, an axis length parameter value (e.g., or lengths) may be based at least in part on angle information. As an example, where an ellipsoid is utilized, an axis of the ellipsoid may be aligned with an angle. As an example, a parameter space may account at least in part for angular deviations (e.g., uncertainty as to an angle of a feature in a geologic environment).

As an example, where dip is utilized, for a fault with a low angle dip, uncertainty may be greater than for a fault with a higher angle dip. As an example, a parameter space parameter value may be determined at least in part based on an amount of dip (e.g., a classification of dip being along a spectrum from low to high). As an example, a method can include accounting for dip in a manner that considers how dip evolves with respect to depth.

As an example, a mesh can include nodes that exist to one side of a fault and nodes that exist to another, opposite side of the fault. In such an example, mathematically (e.g., computationally), nodes on one side of the fault may lack connectivity with nodes on the other side of the fault. As an example, at an extremity of a fault, nodes adjacent thereto and adjacent to other nodes can include connectivity. As an example, a vicinity of a fault can be defined by mesh elements (e.g., cells, etc.) that exist on sides of the fault and at extremities of the fault. As an example, such a vicinity may terminate at another fault. For example, another fault may define a boundary of the vicinity or neighborhood of a region of interest. As an example, the other fault may have its own associated vicinity or neighborhood, which may, for example, terminate at a fault (e.g., or faults). As an example, vicinities or neighborhoods associated with features such as faults may overlap.

As an example, a vicinity or neighborhood may be defined at least in part via a number of elements (e.g., cells, etc.) away from a feature. For example, consider a parameter that specifies a mesh related distance or characteristic to define a vicinity or neighborhood. As an example, consider a parameter that specifies a number of cells such as three cell rings about a fault is to define the vicinity of the fault. As an example, a parameter may depend on an aspect ratio of a feature. For example, a parameter value for a long fault may differ from a parameter value for a shorter fault (e.g., a short fault). As an example, fault length may be specified in terms of nodes, cell length (e.g., element length), etc. As an example, one or more physical properties may be utilized to determine a vicinity (e.g., consider a connectivity as to fluid flow, diffusion, etc.). As an example, a parameter as to a vicinity may depend at least in part on resolution of a mesh.

As an example, a region, a vicinity or a neighborhood may be referred to as a hull. For example, a region may be defined by a convex hull. As an example, deformation may be substantially zero at the surface of the hull. For example, where a hull is defined by nodes of a mesh, such nodes may be fixed while nodes interiorly located may be subject to deformation to generate one or more deformed meshes.

As an example, a hull can include a fault where nodes exist within the hull. In such an example, at least a portion of the nodes within the hull may be repositioned via a parameter space defined by one or more parameter space parameter values. Such an approach may generate one or more deformed meshes within the hull. In such an example, exteriorly to the hull (e.g., and at the "surface" of the hull), a mesh may be maintained, for example, according to a base mesh. As an example, a method can include generating locally deformed meshes for one or more regions of a mesh that represents a geologic environment. In such an example, the locally deformed meshes can include nodes, faces, etc., that may represent one or more features. As an example, a feature may be a fault.

As an example, a base mesh may include one or more hulls where within at least one of the hulls, at least one deformed mesh is generated based at least in part on movement of node positions via a parameter space associated with, for example, uncertainty. In such an example, simulation of physical phenomena may generate sets of results for the hull where, for example, each set of results corresponds to a differently deformed mesh within the hull. As an example, one or more statistical analyses may be performed using at least a portion of the sets of results.

Figure 10:
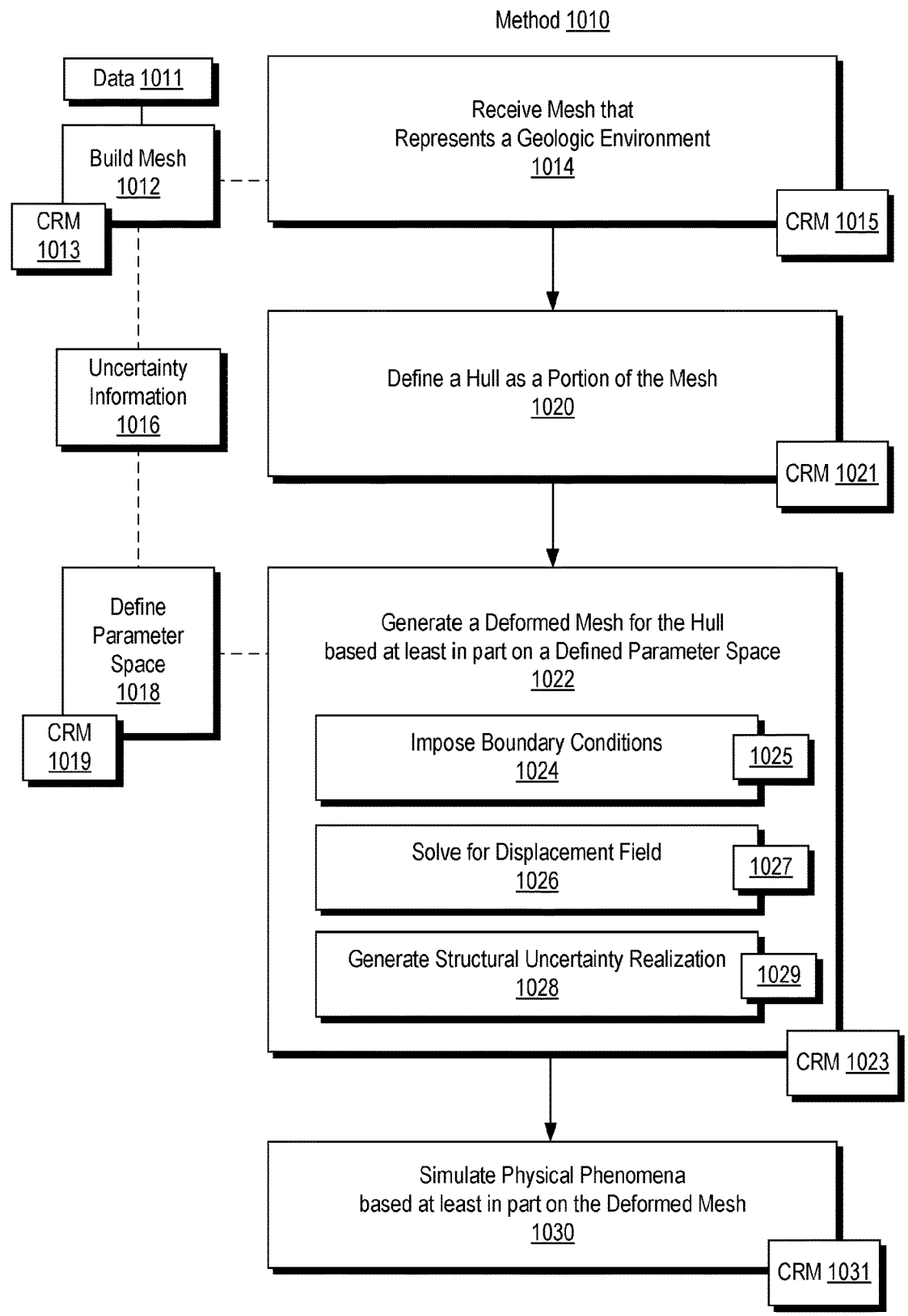
FIG. 10 illustrates an example of a method.

FIG. 10 shows an example of a method 1010 that includes a reception block 1014 for receiving a mesh that represents a geologic environment (e.g., with an amount of uncertainty, etc.), a definition block 1020 for defining a hull as a portion of the mesh, a generation block 1022 for generating a deformed mesh for the hull based at least in part on a defined parameter space (e.g., that accounts for at least a portion of the uncertainty), and a simulation block 1030 for simulating physical phenomena based at least in part on the deformed mesh. As an example, the generation block 1022 can include generating a plurality of deformed meshes and, for example, the simulation block 1030 can include simulating physical phenomena for at least some of the plurality of deformed meshes. In such an example, sets of results may be generated via simulation (e.g., simulation results), which may, for example, be analyzed, optionally statistically.

The method 1010 of FIG. 10 also shows various blocks 1024, 1026 and 1028 as associated with the deformation block 1022. For example, the method 1010 can include the reception block 1014 for receiving a node-based mesh that represents a geologic environment and a structural feature in the geologic environment; the definition block 1018 for defining a node-based parameter space for structural uncertainty of nodes that represent the structural feature in the geologic environment; the definition block 1020 for defining a hull with respect to nodes of a portion of the mesh where the hull encompasses at least a portion of nodes that represent the structural feature; the imposition block 1024, for a system of equations, imposing boundary conditions on the nodes of the hull and on the at least a portion of the nodes that represent the structural feature; the solution block 1026 for solving the system of equations for a displacement field; and the generation block 1028 for generating a structural uncertainty realization of the node-based mesh based at least in part on the displacement field (e.g., where the structural uncertainty realization is a deformed mesh).

As an example, a method can include defining a parameter space and uncertainty information in a manner that may be applied off-cycle. As an example, a method can include performing portions of a method such as the method 1010. For example, a method can include defining a hull as a portion of a mesh for one region, defining another hull as a portion of the mesh for another region, etc. As an example, a method can include generating a deformed mesh for a hull or generating deformed meshes for hulls. As an example, processes may occur in a serial manner, in a parallel manner and/or in serial and parallel manners.

FIG. 10 also shows a data block 1011, a build block 1012 for building a mesh, an uncertainty information block 1016 and a definition block 1018 for defining a parameter space. As an example, data of the data block 1011 may be used in building a mesh that represents a geologic environment that includes features such as, for example, faults. As an example, uncertainty may exist in the data, in building the mesh, etc. Such uncertainty may be characterized by uncertainty information, which may include one or more distributions, etc. (e.g., Gaussian or other distributions). As an example, the definition block 1018 can include defining the parameter space via one or more parameter values, a shape of a parameter space, etc. In such an example, one or more parameter values may be based at least in part on at least a portion of the uncertainty information 1016. As an example, one or more parameter values may be calculated in a manner to represent an aggregation of uncertainties (e.g., different types of uncertainties, uncertainties arising from different sources, etc.).

As an example, the defined parameter space of the generation block 1022 can include one or more parameters that characterize uncertainty (e.g., per the uncertainty information block 1016). For example, a parameter may characterize uncertainty in data (e.g., data of the data block 1011) utilized to build the mesh that represents the geologic environment (e.g., the mesh of the build block 1012 and of the reception block 1014).

As an example, a mesh can be built as in the example method 910 of FIG. 9. As mentioned, the provision block 940 of FIG. 9 may include providing the mesh, receiving the mesh, building the mesh, editing a mesh, etc. based at least in part on receiving input from an input block 912 and input from a conformity/unconformity block 914. For example, a mesh may be built using input per the input block 912, one or more conformities and/or unconformities per the conformity/unconformity block 914. As an example, one or more types of uncertainties may exist for such a mesh, for example, as to input, one or more conformities and/or unconformities, building technique, etc. As an example, a mesh may include information about one or more implicit function and, for example, values of such function or functions, which may be associated with features such as surfaces (e.g., iso-surfaces).

As an example, a mesh can include nodes where a hull is defined as a portion of the mesh that includes at least one node (e.g., per the hull definition block 1020). In such an example, one or more of nodes within a hull may be positioned according to a defined parameter space (e.g., per the parameter space definition block 1018) to generate a deformed mesh within the hull (e.g., per the generation block 1022) while, for example, a remainder of the mesh retains its nodal positions. As an example, a hull may encompass a feature of a geologic environment. For example, a hull may encompass a feature such as a fault.

As an example, a method such as the method 1010 of FIG. 10 can include simulating physical phenomena for a plurality of deformed meshes of a hull that is a portion of a larger mesh. In such an example, the simulating may generate sets of results where each set of results may be referred to as a realization. As an example, a method can include statistically analyzing one or more sets of results.

As an example, a method such as, for example, the method 1010 of FIG. 10 may include performing one or more actions of the method 910 of FIG. 9. For example, a deformed mesh may be used for implicit function interpolation and, for example, iso-surface identification. As an example, the block 970 of FIG. 9 may be implemented for performing one or more additional actions (see, e.g., blocks 972, 974 and 976).

The method 1010 is shown in FIG. 10 in association with various computer-readable media (CRM) blocks 1013, 1015, 1019, 1021, 1023, 1025, 1027, 1029 and 1031. Such blocks generally include instructions suitable for execution by one or more processors (or cores) to instruct a computing device or system to perform one or more actions. While various blocks are shown, a single medium may be configured with instructions to allow for, at least in part, performance of various actions of the method 1010. As an example, a computer-readable medium (CRM) may be a computer-readable storage medium that is not a signal and/or a carrier wave. As an example, blocks may be provided as one or more modules, for example, such as the one or more modules 407 of the system 401 of FIG. 4.

As an example, a method can include estimating and capturing fault framework uncertainty. As an example, a method can include updating a tetrahedral mesh using particular boundary conditions and a geo-mechanical engine, for example, to update a model in a manner that aims to maintain overall structural model consistency so that one or more attributes attached to the mesh (e.g., associated spatially with the mesh) can be used after a realization of an uncertainty run. As an example, an attribute can be an implicit function such as, for example, a stratigraphic function (e.g., functions values that are associated with spatial positions of a mesh, etc.).

As an example, a subterranean structure may be located within a geologic environment where a position or positions of the subterranean structure may be, to some degree, uncertain. For example, a fault may be specified with spatial position uncertainty, which may include orientation uncertainty (e.g., as to dip, etc.).

As an example, a method can include identifying parameters that can influence precision of a fault framework (e.g., or fracture framework) as well as, for example, attributes that may give indications of uncertainty of an interpretation. In such an example, while various classes of metrics may be specified, optionally being different in nature, they may individually have an impact and may thus be merged, for example, into a single parameter. For example, consider a method that includes computing the distribution of the product of two continuous random variables.

As an example, a parameter may be specified to be a degree of freedom of a given node of a triangle mesh of a fault surface. Such a parameter may account for factors that influence precision and attributes that may provide indications of uncertainty of an interpretation or interpretations. As an example, a degree of freedom parameter (DOF parameter) may specify a number of parameters which may be independently varied and may, for example, specify an extent to which one or more parameters may be varied. As an example, a DOF parameter may specify, at least in part, a space in which a node of a mesh may be moved.

FIG. 11 shows examples of geologic environments 1110 and 1120 that include structures such as faults, fractures, etc., which may be represented by fault surfaces, fracture surfaces, etc. In the example environment 1110, a fault may intersect one or more other faults and one or more wells may be present in the environment 1110, which may interest a fault or faults. As shown, the environment 1110 includes a fault network. In the example environment 1120, fractures may be present and, for example, represented as a discrete fracture network (DFN). As an example, fractures can include natural and/or artificial fractures. As shown in FIG. 11, fractures may form a fracture network that is interconnected such that fluid may flow in the fracture network from one fracture to another fracture and, for example, to one or more wells.

In the examples of FIG. 11, faults and/or fractures may be represented within a tetrahedral mesh by triangulated surfaces. As an example, a method can include triangulation of one or more surface. Such a method may be associated with a gridding or meshing technique that, for example, aims to fill a volume with tetrahedra.

As an example, a triangulated surface may be a net of triangles, which covers a given surface partly or totally. As an example, triangulation of a surface may be a procedure of generating nodes and triangles of such a net of triangles.

As an example, a triangulation may be a Delaunay triangulation (DT). For example, consider a Delaunay triangulation for a set P of points in a plane to be defined as a triangulation DT(P) such that no point in P is inside the circumcircle of a triangle in DT(P). Delaunay triangulation can aim to maximize the minimum angle of the angles of the triangles in the triangulation, for example, to have a tendency to avoid "skinny" triangles (e.g., triangles that may be characterized by an aspect ratio, a height to base ratio, a base to height ratio, etc.).

Delaunay triangulation may be implemented to build a mesh for a space-discretized solver (e.g., consider the finite element method and the finite volume method), which may benefit from an angle guarantee. As an example, a domain to be meshed may be specified as a coarse simplicial complex. As an example, for a mesh to be numerically stable for a solver, a method can include mesh refinement (e.g., consider user of Ruppert's algorithm, etc.).

In mesh generation, Ruppert's algorithm, which may be referred to as Delaunay refinement, is an algorithm that can be implemented for creating Delaunay triangulations with a particular level of quality. As an example, such an algorithm may be implemented to take a planar straight-line graph (e.g., or in dimension higher than two a piecewise linear system) and return a conforming Delaunay triangulation of so-called quality triangles. In such an example, a triangle may be classified as being of poor-quality (e.g., compared to classification as being of acceptable quality) if it has a circumradius to shortest edge ratio larger than a prescribed threshold.

As an example, an algorithm may include Delaunay triangulation of input vertices (e.g., nodes) followed by operations such as, for example, inserting the midpoint of a segment with non-empty diametral circles into the triangulation; and inserting the circumcenter of a poor-quality classified triangle into the triangulation, unless the circumcenter lies in the diametral circle of some segment (e.g., in this case, the encroached segment may be split instead). Such operations may optionally be repeated until poor-quality classified triangles do not exist and segments are not encroached.

As an example, a mesh may be a multidimensional mesh and may optionally be built via implementation of one or more algorithm, which can include one or more quality control algorithms. As an example, a mesh may be a triangulated mesh on a surface where triangles on the surface may be faces of tetrahedra.

As an example, a mesh may be generated at least in part via an automated meshing algorithm. In such an example, one or more distorted and/or unusable grid elements may be generated. As an example, smoothing may be applied as mesh refinement technique, for example, to reposition nodal locations so as to minimize element distortion. As an example, a stretched grid method may provide for generation of a pseudo-regular mesh that may meet the Delaunay criteria.

As an example, a method may include adjusting one or more spatial characteristics of a subterranean structure. For example, consider adjusting the position of a fault in a geologic environment. Such an adjustment may result in adjustment of a mesh. For example, one or more nodes of a mesh may be moved to different locations, which, in turn, may alter dimensions of a tetrahedron, a triangle, etc. As an example, where a triangle becomes "skinny" (e.g., height to base ratio greater than about 10), the triangle may give rise to some amount of numerical instability. Such a triangle may be referred to as a distorted triangle, which may be, for example, practically unusable.

Referring again to the degree of freedom parameter (e.g., a DOF parameter), such a parameter may be utilized by a method that includes spatial adjustments to one or more subterranean structures in a geologic environment represented by a mesh. As an example, DOF parameters may be defined for nodes of a triangulated surface of a subterranean structure such as, for example, a fault or a fracture.

Figure 12:
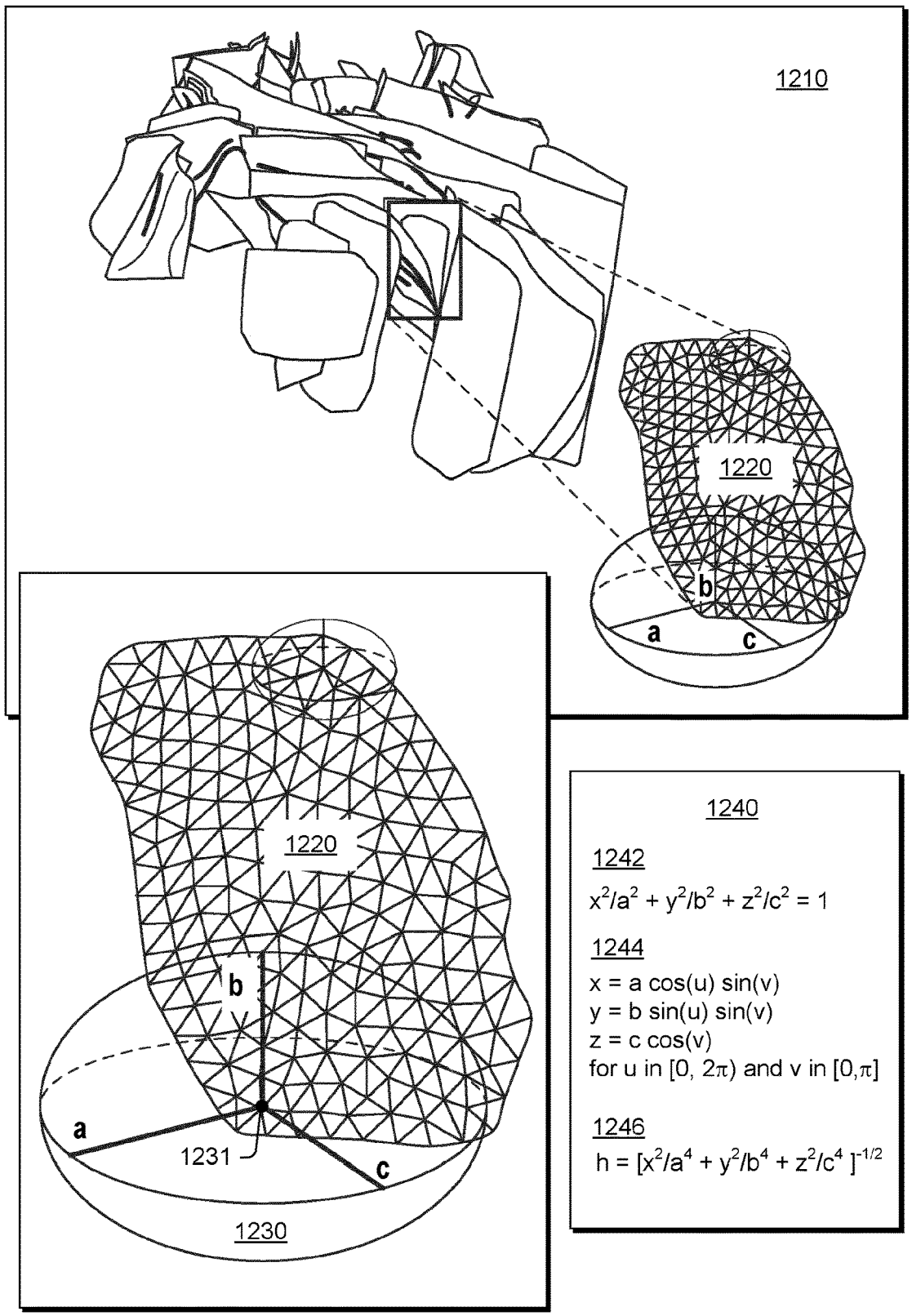
FIG. 12 illustrates an example of a geologic environment, an example of a portion of a mesh and an example of a parameter space.

FIG. 12 shows an example of a network of structures 1210 where a surface of a structure 1220 can be represented via triangles. As an example, a DOF analysis may be referenced with respect to a geometric shape such as, for example, an ellipsoid 1230. In the example of FIG. 12, the ellipsoid 1230 includes parameters a, b and c, which may be utilized in one or more equations 1240. For example, consider an equation for an ellipsoid 1242, a parametric set of equations for an ellipsoid 1244 and a support function equation 1246 of an ellipsoid.

As an example, degree of freedom may be represented as an attribute of a fault, for example, where a, b, c of an ellipsoid may be assigned one or more values (e.g., values of two or more of a, b and c may be approximately the same or differ).

As an example, degree of freedom can, in a general form, be represented by an ellipsoid. For example, the major axis and the minor axis of an ellipsoid (e.g., centered on a node of a triangle-mesh) can be aligned with vectors of a global referential or a local referential. A method may implement an ellipsoid-based degree of freedom approach using, for example, one or more of a global and/or a local reference, which may depend on performance of one or more processes.

Referring again to FIG. 12, the ellipsoid 1230 is centered on a node 1231 of the triangulated surface 1220 where parameters a, b and c of the ellipsoid can quantify degree of freedom for the node 1231.

As an example, for a given fault (e.g., or fracture), the degree of freedom of a node can define an "envelop" around an initial fault geometry. The latter can define, for example, a "realization space" in which the defined fault can theoretically take shape given one or more local constrains at a node following its degree of freedom.

Figure 13:
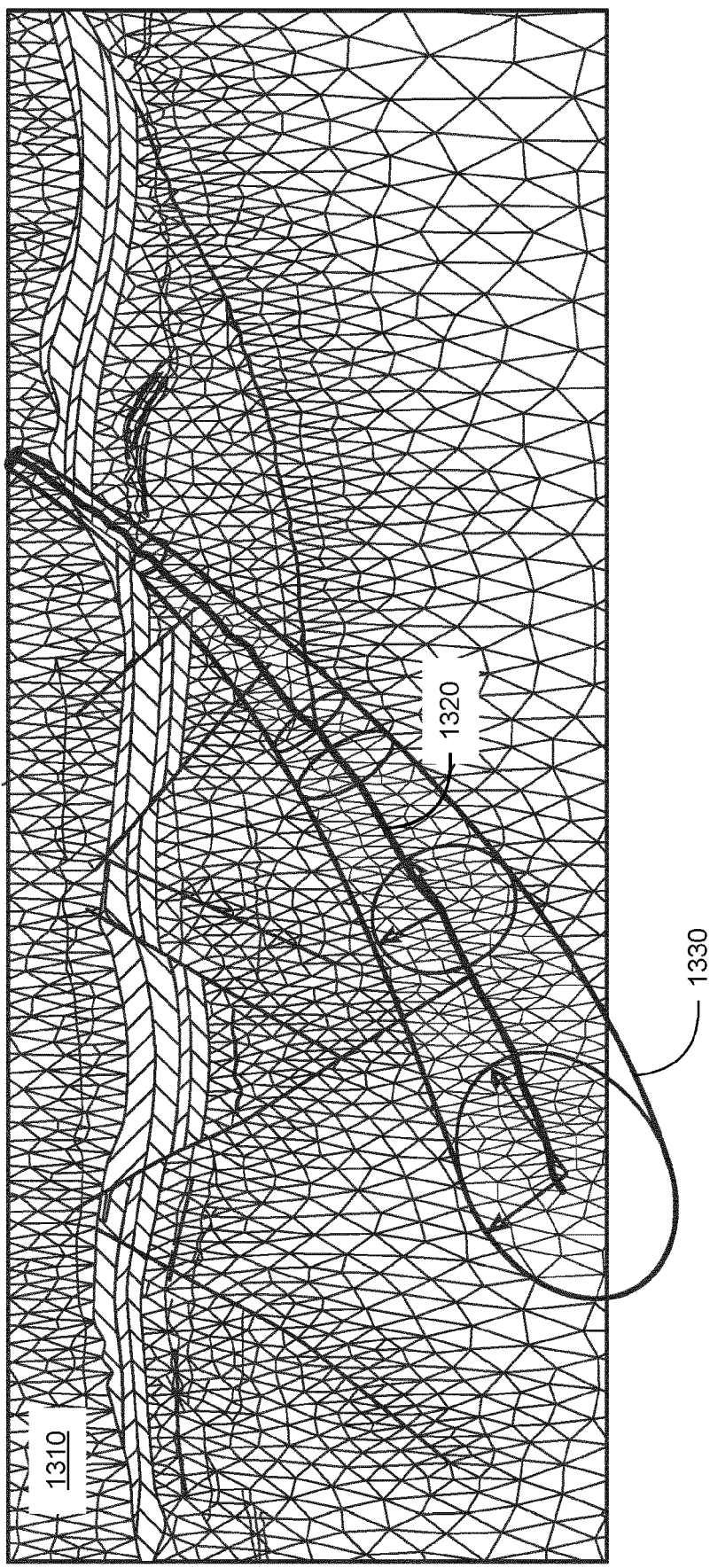
FIG. 13 illustrates an example of a parameter space envelope with respect to a fault.

FIG. 13 shows an example of an environment 1310 that includes a fault 1320 about which an envelope 1330 is defined based at least in part on degree of freedom. In such an example, the envelope 1330 may be referred to as a degree of freedom envelop, for example, for a given fault represented in a 2D slice.

As an example, an envelope may vary with respect to one or more factors. For example, as mentioned, dip of a fault may be relatively low and be associated with more uncertainty than a higher dip. In such an example, an envelope may depend on dip where greater uncertainty exist as dip approaches horizontal (e.g., lower uncertainty as dip approaches vertical).

Referring again to the example of FIG. 13, the size of the envelope 1330 is shown as being dependent on the angle of the fault 1320. For example, as dip approaches horizontal, the size of the envelope increases or, in other words, as dip approaches vertical, the size of the envelope decreases.

As an example, a method can include calculating degree of freedom for individual nodes associated with hulls that include respective faults of a fault network of a geologic environment. Degree of freedom may capture uncertainty as to nodal locations. Such an approach can include generating realizations where each realization includes a deformed mesh within a hull where deformation is based at least in part on calculated degree of freedom. Such a method may include simulating physical phenomena based at least in part on realizations to generate sets of results that may be, for example, statistically analyzed.

As an example, a mesh may be modified (e.g., deformed) in a relatively geologically consistent fashion. For example, one or more boundary conditions may be imposed. In such an example, "attributes" may be stored in association with nodes of a mesh where such attributes may be re-used to extract a "new version/realization" of a structural model.

As an example, degree of freedom may be coupled with one or more geometrical and/or geologically consistent constrains. For example, an influence volume may define a zone within which mesh nodes can be modified. In such an example, influence volume may be defined via an equation such as, for example:

influence volume=$ap$*envelope of the degree of freedom where "ap" can be an adaptive parameters, which may be, for example, constant for a model, set at a fault level, etc.

As an example, another constraint may be an authorized deformation of a given element (e.g., a tetrahedron, etc.).

For example, an authorized deformation parameter may govern in-between each realization how much a tetrahedron can be modified with respect to its initial shape. As an example, a relatively low authorized deformation parameter value coupled with a relatively small influence volume parameter value may allow for relatively little deformation of at least a portion of a fault network, for example, even if the degree of freedom is relatively large. In such an example, deformations may result in relatively small variations of a structural model. In contrast, one or more other parameterizations may allow for relatively large variations in deformation, for example, optionally maximal within a range of degree of freedom.

Figure 14:
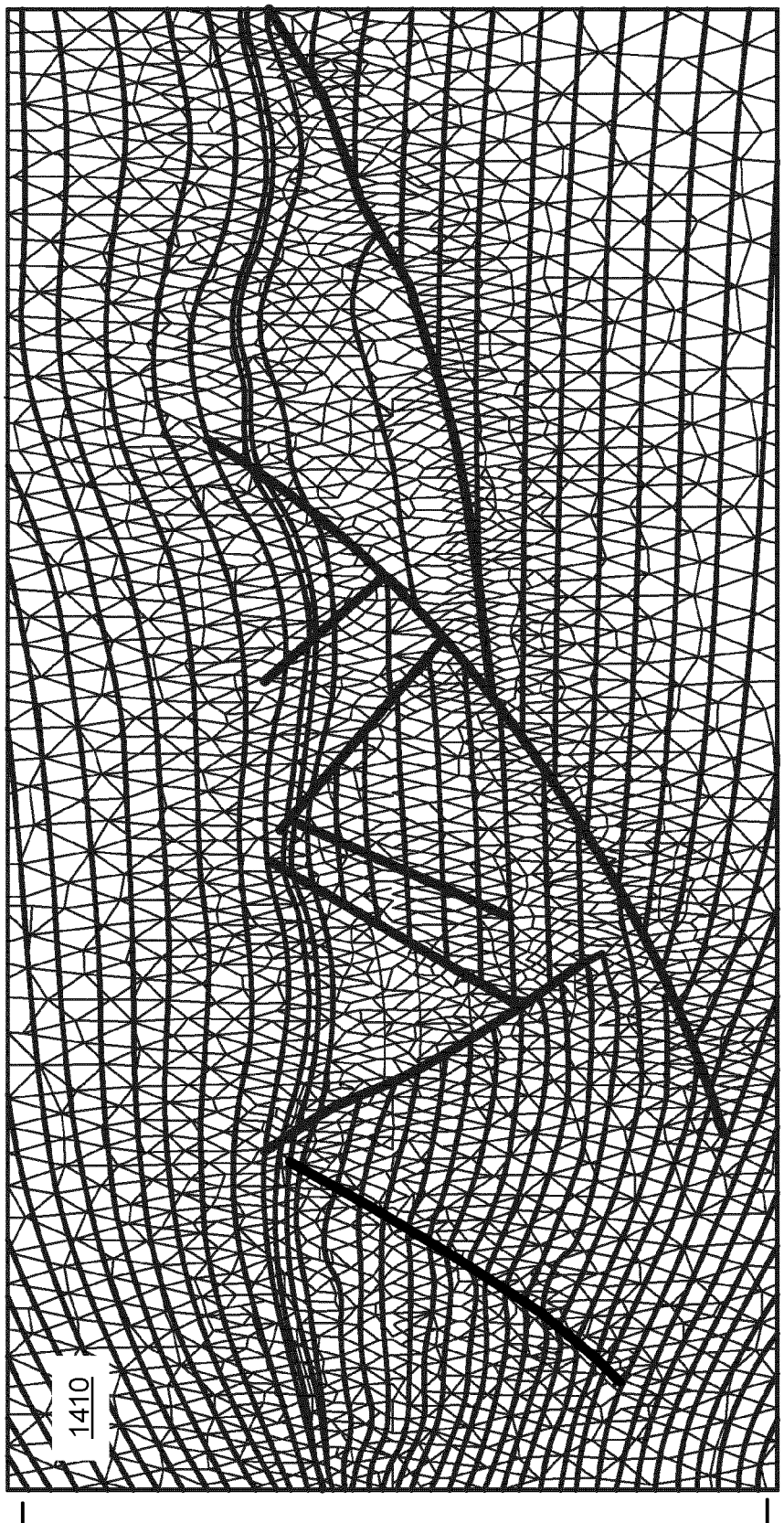
FIG. 14 illustrates an example plot of implicit function iso-values associated with a mesh that represents a geologic environment.

FIG. 14 shows an example of a mesh with stratigraphic function values (e.g., iso-values), which may be stored in association with the mesh (e.g., mesh elements, mesh nodes, etc.).

As an example, a method may employ one or more constrains that aim to ensure some amount of geological validity of a realization. For example, consider a shape deviation constraint. In such an example, this may provide for authorized deformation of fault geometry with respect to an initial shape (e.g., a base shape). As another example, consider a relative angle constraint. In such an example, such a constraint may aim to limit variation of dip that a realization of a fault can have with respect to its initial orientation (e.g., a base orientation).

As an example, a method may include deforming one or more regions of a mesh that represents a geologic environment and, for example, extracting iso-values of an implicit function (e.g., stratigraphic function coupled with a volume base modeling approach) corresponding to horizons of a base-case and, for example, applying one or more residuals (e.g., to progress from a draft resolution to a refined one) that may stem from a least-square adjustment for a base case. As an example, an individual realization may recreate a geologically consistent structural model in a robust fashion.

As an example, a method can include implementing a mesh adaptation process. As an example, once degree of freedom as to one or more geological entities is defined, a method can include generating realizations by sampling a statistical envelope of each degree of freedom. As an example, an amount of samples may depend on the number of geological features (e.g., number of faults to be considered) and degree of uncertainty associated with respective geological features. As an example, a method can include selecting one or more faults to be modified for generation of a realization.

FIG. 15 shows an example of a portion of a mesh 1510 and shows an example of a portion of a mesh 1530. In the portion 1510, a boundary 1511 encompasses elements 1512 as well as a fault at a first location and orientation 1514 and at a second location and orientation 1516. In adjusting the elements 1512 (e.g., nodes thereof) to accommodate the second location and orientation 1516, the portion 1530 may result. As shown in the example of FIG. 15, the portion 1530 includes a boundary 1531 that encompasses element 1532 as well as the fault at a first location and orientation 1534 and at the second location and orientation 1536. In accommodating the second location and orientation 1536, the elements 1532 include an element 1538 that has an aspect ratio that differs from aspect ratios of other elements. Specifically, the element 1538 may be deemed to be skinny as its base (e.g., near the fault) is relatively small compared to its height (e.g., a distance from the fault to the boundary 1531). Such an element may be referred to as a distorted element, which may impact, for example, calculations, stability of convergence, etc.

As an example, a method can include generating a realization via deformation of a portion of a mesh based at least in part on uncertainty associated with a geological feature. In such an example, the deformation may be applied to a base mesh (e.g., or an intermediate mesh, optionally one that has been previously subject to deformation). As an example, in deforming a mesh, a method can include implementing one or more techniques that aim to avoid undesirable distortion to one or more elements (e.g., tetrahedra), which may be in the vicinity of a feature such as a fault.

As an example, a method can include selecting a number of tetrahedra about a fault or faults to be deformed to provide a hull of deformation. As an example, such a hull may be made large enough to avoid perturbing one or more of faults, fault tip loops and fault connections. As an example, a method can include sizing a hull based at least in part on connectivity information, which may be stored in association with a mesh (e.g., at a mesh level).

As an example, a method can include traversing tetrahedra in a number of rings (e.g., n-rings) around one or more flagged faults. In such an example, tetrahedra whose facets belong to one or more faults may be selected to be members of a set. For example, a method can include collecting a first number of tetrahedra that include tetrahedra that may not belong to a desired set and that share a facet with a tetrahedron of the desired set. Such a collection of tetrahedra may be appended to the desired set of tetrahedra. As an example, one or more geometric criteria (e.g., maximum distance to a fault) may be used in an effort to avoid appending tetrahedra (e.g., elements) in the set that may be too far from one or more faults.

As an example, a method can include hull selection or hull definition. For example, given a particular feature represented in a mesh, a method can include defining a hull that includes various nodes, elements, etc. of a portion of the mesh. In such an example, the hull may be defined to include the feature or at least a portion of the feature, for example, depending on the types of physical phenomena associated with the feature, its proximity to one or more other features, its position, its orientation, etc. As an example, a hull may be defined by a boundary, which may optionally be specified via mesh nodes, mesh faces, etc.

FIG. 16 shows an example of a portion of a mesh 1610 with a boundary 1611 and faults 1614 and 1616 and an example of a portion of a mesh 1630 with a boundary 1631 and faults 1634 and 1636. In FIG. 16, the portion 1610 illustrates selection of elements that form the boundary 1611 based on a distance metric while the portion 1630 illustrates selection of elements that form the boundary 1631 based at least in part on a ring metric (e.g., n=3). As shown, the n-ring traversal approach allows for capture of appropriate mesh connectivity with respect to the fault 1636 and can act to avoid gathering elements that are not connected to an original set. As seen in the portion 1610, the distance metric approach extends to irrelevant degrees of freedom on the other side of the fault 1614.

As an example, a defined hull can allow for smoothing of deformation imposed to a mesh. For example, a mesh can spatially include or encompasses a defined hull or, for example, be mathematically coupled to a defined hull at least in part via a boundary that defines, at least in part, the hull. For example, shared nodes and faces may exist between a mesh and a defined hull. As an example, smoothing may provide a transition region between a mesh and a hull that is amenable to computations with reduced risk of errors.

As an example, deformation may be based at least in part on a kernel. For example, consider one or more of the following types of kernels as examples: harmonic, bi-harmonic or elastic; noting that one or more other types of kernels may be utilized. As an example, a method can include selecting a kernel, which may be, for example, one of a plurality of kernels. As an example, a method can include selecting a kernel or kernels. As an example, where three different types of kernels exist, up to three different types of partial derivative equations (e.g., on the displacement field) may be formulated that can be discretized on an underlying mesh, for example, using the finite element method (FEM).

As an example, a method can include formulating equations via the finite element method (FEM) using finite elements and imposing boundary conditions on various finite elements (e.g., finite elements that define a boundary, etc.). As an example, a mesh may define finite elements. For example, nodes of a mesh may define nodes of finite elements.

As an example, a method can include generating a system of linear equations with boundary conditions such as, for example, boundary conditions that pertain to imposed displacement on degrees of freedom that are on one or more features such as, for example, one or more faults, and to zero displacement on degrees of freedom that are on border of a hull (e.g., a boundary of a hull may be set to zero displacement as it may be shared with a mesh or be considered a mesh interface for the hull).

As an example, a computation scheme can include computing displacement by solving a linear system of equations, which may be defined by the following generalized equation:

$$A*u=b$$

where the right hand side b includes terms linked to the boundary conditions, where A is a matrix and where u is a vector of unknowns.

In such an example, solving for the vector of unknowns, u, can involve inverting the linear system $u=A^{-1}*b$, which may be accomplished relatively expeditiously, for example, using one or more matrix factorization algorithms.

As an example, a method can include modifying an amount of displacement on one or more faults (e.g., by creating another realization). In such an example, referring again to the equation for the linear system, this implies changing the right hand side b, which may be accomplished in linear time with respect to the number of degrees of freedoms inside a deformation hull (e.g., a defined hull that includes a deformed mesh). Such an approach may allow for computing a relatively large number of realizations on a predetermined number of faults in an expeditious manner.

As an example, once a displacement field (e.g., unknowns, u) has been computed, mesh geometry may be updated by adding the computed displacement of the original degrees of freedom positions. For example, positions of nodes of a mesh may be adjusted based on a computed displacement field.

As an example, a method can involve utilization of a tetrahedral mesh on top of which uncertainty on a fault framework (e.g., a fault network, etc.) is captured via the degree of freedom of a mesh-node. In such an example, structural uncertainty may be taken into account where such uncertainty may stem from one or more sources. As mentioned, a hull may be defined that includes nodes that can be adjusted according to a parameter space that is defined to account for at least a portion of uncertainty that may exist (e.g., as to data, interpretation, calculations, etc.).

As an example, one or more defined parameter spaces may be sampled to determine how one or more nodes are to be positioned to generate a deformed mesh or deformed meshes. As an example, sampling may be performed using one or more statistical approaches. As an example, a parameter space may be randomly sampled as to parameter values for displacement(s) of a node. Such sampling may be within the parameter space which may be defined as a surface such as, for example, a surface of an ellipsoid (e.g., a triaxial ellipsoid). Such an ellipsoid may be defined by parameter values where sampled values are, for example, less than or equal to the parameter values (e.g., such that the sampled values are with the parameter space).

FIG. 17 shows an example of a system 1700 that includes various modules such as a data analysis module 1710, a mesh building module 1720, a parameter space definition module 1730, a hull definition module 1740, a simulation module 1750 and an implicit function module 1760. As shown, the module 1710 can include features for interpretation, attribute calculation, uncertainty assessment, etc. As shown, the module 1720 can include features to define and locate nodes, triangles (e.g., or other shapes), tetrahedra (e.g., or other volumetric shapes), etc. As shown, the module 1730 can include features to define a shape or shapes, one or more parameters, assess uncertainty (e.g., to determine shape(s), parameter value(s), etc.), etc. As shown the module 1740 can include features to define a hull shape or shapes, to define and/or assess hull connectivity, to handle or assess geological features, etc. As shown, the module 1750 can include features for a mesh or meshes, a hull or hulls, generating a result or results, etc. As an example, the module 1750 can include features for solving one or more systems of linear equations, for example, as to displacements. As shown, the module 1760 can include features for a mesh or meshes, handling conformities and/or unconformities, performing one or more interpolations (e.g., as to one or more implicit functions), etc. As an example, the module 1760 may include features for determining values for one or more stratigraphic functions. As an example, the module 1760 may include receiving displacements and adjusting a mesh based at least in part on such displacements and then interpolating one or more implicit functions using at least a portion of the adjusted mesh.

The system 1700 may be implemented, for example, to generate realizations and, for example, simulation results from at least a portion of the realizations. As an example, one or more statistical analyses may be performed as part of realization generation, results analysis, etc. As an example, the system 1700 may include and/or be implemented at least in part via a computing system (e.g., an information handling system, etc.) such as, for example, the system 401 of FIG. 4. For example, modules of the system 1700 may be akin to modules 407 of the system 401.

As an example, a method can include receiving a node-based mesh that represents a geologic environment and a structural feature in the geologic environment; defining a node-based parameter space for structural uncertainty of nodes that represent the structural feature in the geologic environment; defining a hull with respect to nodes of a portion of the mesh where the hull encompasses at least a portion of nodes that represent the structural feature; for a system of equations, imposing boundary conditions on the nodes of the hull and on the at least a portion of the nodes that represent the structural feature; solving the system of equations for a displacement field; and generating a structural uncertainty realization of the node-based mesh based at least in part on the displacement field. In such an example, the method can include calculating attributes for the structural uncertainty realization of the node-based mesh. As an example, attributes can be stratigraphic function values (e.g., values of a stratigraphic function).

As an example, a method can include performing a simulation of physical phenomena based at least in part on a structural uncertainty realization of a node-based mesh.

As an example, a system of equations can be a linear system of equations. In such an example, boundary conditions may be imposed. As an example, a formulation may be $A*u=b$ where $A$ is a matrix associated with a system of equations, u is a displacement field and b includes boundary condition information. In such an example, the displacement field u may be solved subject to the boundary condition information. As an example, the displacement field u may be used to adjust at least one node of a node-based mesh.

As an example, boundary conditions can include fixed boundary conditions, for example, on nodes of a hull. For example, a hull may be a portion of a node-based mesh where the interface between the hull and the remainder of the node-based mesh may be subject to boundary conditions, which may be fixed boundary conditions such that the nodes at the interface are not displaced (e.g., spatially fixed). In such an example, displacement may be calculated as to nodes within the hull (e.g., displacement may be isolated to within the hull). Such an approach may act to preserve spatial positions of nodes in the node-based mesh that exist at the interface (e.g., outer boundary) of the hull and exterior to the interface (e.g., outer boundary) of the hull. As an example, displacement may be calculated as a displacement field. In such an example, the displacement field may be utilized to adjust one or more nodes within a hull (e.g., within a space defined by an outer boundary of a hull).

As an example, boundary conditions can include displacement boundary conditions, for example, on at least a portion of nodes that represent a structural feature. In such an example, the at least a portion of nodes may be within a hull where the boundary conditions are imposed at the outer boundary of the hull (e.g., a hull and mesh interface). As an example, a system of equations may be solved for a displacement field where values of the displacement field are determined at least in part via one or more boundary conditions. As an example, values of a displacement field may be utilized to generate a deformed mesh, which may be a portion of a larger mesh. For example, values of a displacement field may be calculated for a hull that is encompassed by a larger mesh and that includes a mesh therein (e.g., a mesh defined by a boundary of a hull). Such values may be used to adjust the mesh within the hull to generate a deformed mesh as a portion of the larger mesh.

As an example, a system of equations can be based at least in part on a kernel. As an example, one or more of a harmonic kernel, a bi-harmonic kernel or an elastic kernel may be utilized; noting that one or more other types of kernels may be utilized.

As an example, a structural feature can be or include a fault. As an example, uncertainty may exist as to the spatial location and/or extent of the fault.

As an example, a method can include displacing nodes within a hull based at least in part on displacements of a displacement field as part of a process that include generating a structural uncertainty realization of a node-based mesh. In such an example, displacing the nodes can generate a new mesh as the structural uncertainty realization.

As an example, a node-based parameter space can be or include a volume defined by at least one parameter. For example, consider an ellipsoid as a volume. In such an example, the ellipsoid can be defined via parameters such as, for example, semi-axes parameters. As an example, consider parameters a, b and c where points (a,0,0), (0,b,0) and (0,0,c) lie on the surface of an ellipsoid and where line segments from the origin of the ellipsoid to these points are the semi-principal axes of length a, b, c (e.g., the parameters a, b and c). Such lengths can correspond to the semi-major axis and semi-minor axis of the appropriate ellipses within the ellipsoid. While an ellipsoid is mentioned as a type of space, a parameter space may be defined via one or more other types of spaces.

As an example, a node-based parameter space can include a number of degrees of freedom. As an example, degrees of freedom may be represented to be along one or more axes. For example, degrees of freedom may be defined with respect to axes of an ellipsoid or other type of space.

As an example, a system can include a processor; memory operatively coupled to the processor; and one or more modules that include instructions stored in the memory and executable by the processor to instruct the system where the instructions include instructions to: receive a node-based mesh that represents a geologic environment and a structural feature in the geologic environment; define a node-based parameter space for structural uncertainty of nodes that represent the structural feature in the geologic environment; define a hull with respect to nodes of a portion of the mesh where the hull encompasses at least a portion of nodes that represent the structural feature; for a system of equations, impose boundary conditions on the nodes of the hull and on the at least a portion of the nodes that represent the structural feature; solve the system of equations for a displacement field; and generate a structural uncertainty realization of the node-based mesh based at least in part on the displacement field. In such an example, the one or more modules can include a simulation module that simulates physical phenomena based at least in part on the structural uncertainty realization. As an example, a system can include a stratigraphic function module that generates stratigraphic function values for a structural uncertainty realization of a node-based mesh.

As an example, one or more computer-readable storage media can include computer-executable instructions to instruct a computing device where the instructions can include instructions to: receive a node-based mesh that represents a geologic environment and a structural feature in the geologic environment; define a node-based parameter space for structural uncertainty of nodes that represent the structural feature in the geologic environment; define a hull with respect to nodes of a portion of the mesh where the hull encompasses at least a portion of nodes that represent the structural feature; for a system of equations, impose boundary conditions on the nodes of the hull and on the at least a portion of the nodes that represent the structural feature; solve the system of equations for a displacement field; and generate a structural uncertainty realization of the node-based mesh based at least in part on the displacement field. In such an example, the instructions can include instructions to simulate physical phenomena based at least in part on the structural uncertainty realization. As an example, instructions can include instructions to define at least one boundary condition based at least in part on sampling of the parameter space. As an example, a parameter space may be defined via one or more parameters such that the parameter space represents uncertainty such as, for example, structural uncertainty as to a structure that exists in a geologic environment. As an example, one or more techniques may be utilized to sample a parameter space. For example, consider a statistically-based technique that can sample a parameter space. As an example, a sampling technique may be include utilizing one or more random number generators (e.g., one or more random number generation algorithms, etc.).

Figure 18:
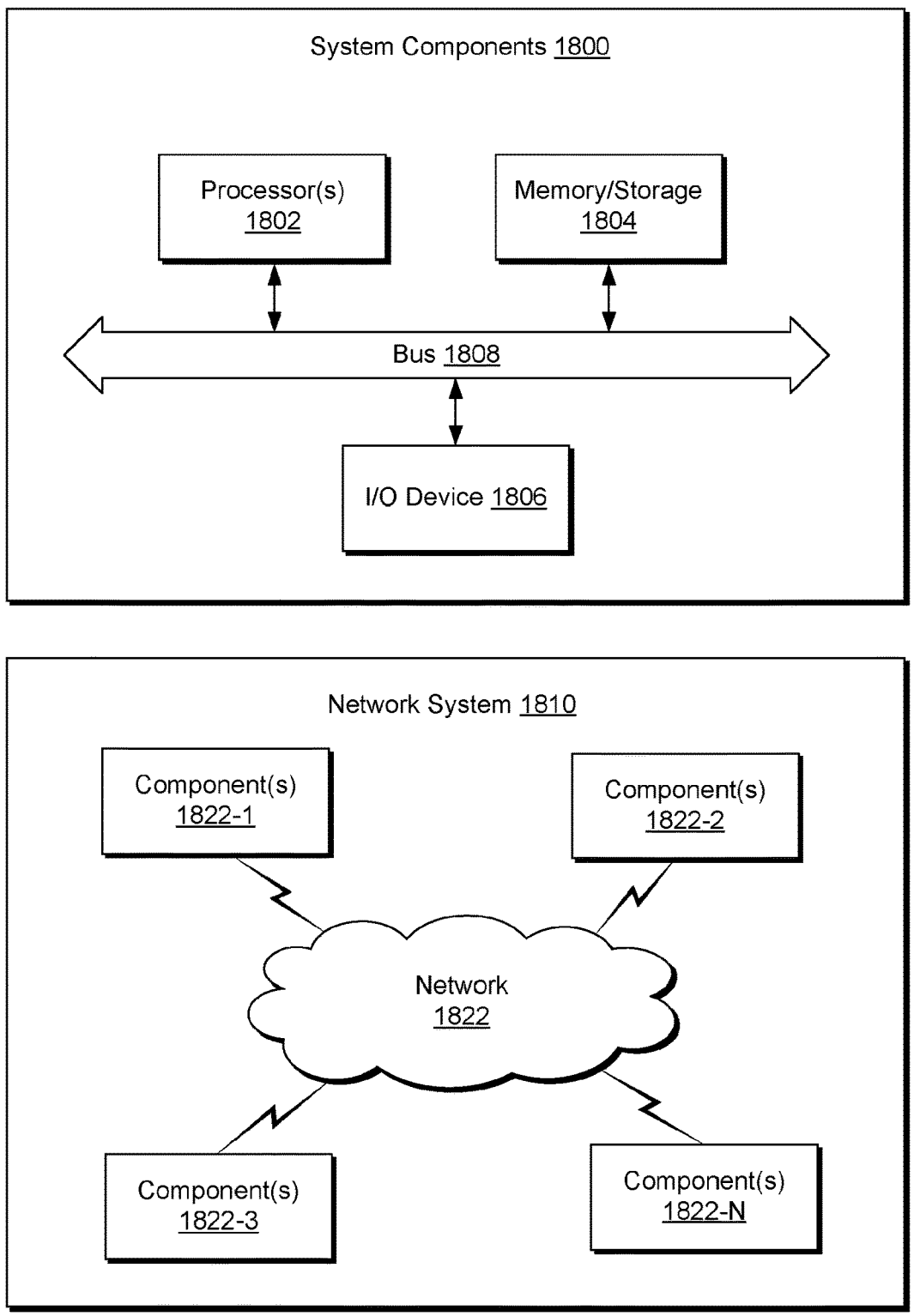
FIG. 18 illustrates example components of a system and a networked system.

FIG. 18 shows components of an example of a computing system 1800 and an example of a networked system 1810. The system 1800 includes one or more processors 1802, memory and/or storage components 1804, one or more input and/or output devices 1806 and a bus 1808. In an example embodiment, instructions may be stored in one or more computer-readable media (e.g., memory/storage components 1804). Such instructions may be read by one or more processors (e.g., the processor(s) 1802) via a communication bus (e.g., the bus 1808), which may be wired or wireless. The one or more processors may execute such instructions to implement (wholly or in part) one or more attributes (e.g., as part of a method). A user may view output from and interact with a process via an I/O device (e.g., the device 1806). In an example embodiment, a computer-readable medium may be a storage component such as a physical memory storage device, for example, a chip, a chip on a package, a memory card, etc. (e.g., a computer-readable storage medium).

In an example embodiment, components may be distributed, such as in the network system 1810. The network system 1810 includes components 1822-1, 1822-2, 1822-3, . . . 1822-N. For example, the components 1822-1 may include the processor(s) 1802 while the component(s) 1822-3 may include memory accessible by the processor(s) 1802. Further, the component(s) 1802-2 may include an I/O device for display and optionally interaction with a method. The network may be or include the Internet, an intranet, a cellular network, a satellite network, etc.

As an example, a device may be a mobile device that includes one or more network interfaces for communication of information. For example, a mobile device may include a wireless network interface (e.g., operable via IEEE 802.11, ETSI GSM, BLUETOOTH®, satellite, etc.). As an example, a mobile device may include components such as a main processor, memory, a display, display graphics circuitry (e.g., optionally including touch and gesture circuitry), a SIM slot, audio/video circuitry, motion processing circuitry (e.g., accelerometer, gyroscope), wireless LAN circuitry, smart card circuitry, transmitter circuitry, GPS circuitry, and a battery. As an example, a mobile device may be configured as a cell phone, a tablet, etc. As an example, a method may be implemented (e.g., wholly or in part) using a mobile device. As an example, a system may include one or more mobile devices.

As an example, a system may be a distributed environment, for example, a so-called "cloud" environment where various devices, components, etc. interact for purposes of data storage, communications, computing, etc. As an example, a device or a system may include one or more components for communication of information via one or more of the Internet (e.g., where communication occurs via one or more Internet protocols), a cellular network, a satellite network, etc. As an example, a method may be implemented in a distributed environment (e.g., wholly or in part as a cloud-based service).

As an example, information may be input from a display (e.g., consider a touchscreen), output to a display or both. As an example, information may be output to a projector, a laser device, a printer, etc. such that the information may be viewed. As an example, information may be output stereographically or holographically. As to a printer, consider a 2D or a 3D printer. As an example, a 3D printer may include one or more substances that can be output to construct a 3D object. For example, data may be provided to a 3D printer to construct a 3D representation of a subterranean formation. As an example, layers may be constructed in 3D (e.g., horizons, etc.), geobodies constructed in 3D, etc. As an example, holes, fractures, etc., may be constructed in 3D (e.g., as positive structures, as negative structures, etc.).

Although only a few example embodiments have been described in detail above, those skilled in the art will readily appreciate that many modifications are possible in the example embodiments. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words "means for" together with an associated function.

The invention claimed is:

1. A method comprising:
receiving a node-based mesh that represents a geologic environment and a structural feature in the geologic environment;
defining a node-based parameter space for structural uncertainty of nodes that represent the structural feature in the geologic environment;
defining a convex hull with respect to nodes of a portion of the mesh wherein the convex hull encompasses at least a portion of nodes that represent the structural feature;
for a system of equations, imposing boundary conditions on the nodes of the convex hull and on the at least a portion of the nodes that represent the structural feature;
solving the system of equations for a displacement field, wherein the system of equations are based at least in part on a kernel that smooths the displacement field for the portion of the mesh of the convex hull with respect to another portion of the mesh; and
generating a structural uncertainty realization of the node-based mesh based at least in part on the displacement field.

2. The method of claim 1 further comprising calculating attributes for the structural uncertainty realization of the node-based mesh.

3. The method of claim 2 wherein the attributes comprises stratigraphic function values.

4. The method of claim 1 further comprising performing a simulation of physical phenomena based at least in part on the structural uncertainty realization of the node-based mesh.

5. The method of claim 1 wherein the system of equations comprises a linear system of equations.

6. The method of claim 1 wherein the boundary conditions comprise fixed boundary conditions on the nodes of the convex hull.

7. The method of claim 1 wherein the boundary conditions comprise displacement boundary conditions on the at least a portion of the nodes that represent the structural feature.

8. The method of claim 1 comprising selecting the kernel from a plurality of different kernels.

9. The method of claim 1 wherein the structural feature comprises a fault.

10. The method of claim 1 wherein the generating comprises displacing nodes within the convex hull based at least in part on displacements of the displacement field.

11. The method of claim 10 wherein displacing the nodes generates a new mesh as the structural uncertainty realization.

12. The method of claim 1 wherein the node-based parameter space comprises a volume defined by at least one parameter.

13. The method of claim 12 wherein the volume comprises an ellipsoid.

14. The method of claim 1 wherein the node-based parameter space comprises a number of degrees of freedom.

15. A system comprising:
a processor;
memory operatively coupled to the processor; and
instructions stored in the memory and executable by the processor to instruct the system wherein the instructions comprise instructions to:
receive a node-based mesh that represents a geologic environment and a structural feature in the geologic environment;
define a node-based parameter space for structural uncertainty of nodes that represent the structural feature in the geologic environment;
define a convex hull with respect to nodes of a portion of the mesh wherein the convex hull encompasses at least a portion of nodes that represent the structural feature;
for a system of equations, impose boundary conditions on the nodes of the convex hull and on the at least a portion of the nodes that represent the structural feature;
solve the system of equations for a displacement field, wherein the system of equations are based at least in part on a kernel that smooths the displacement field for the portion of the mesh of the convex hull with respect to another portion of the mesh; and
generate a structural uncertainty realization of the node-based mesh based at least in part on the displacement field.

16. The system of claim 15 wherein the instructions comprises instructions to simulate physical phenomena based at least in part on the structural uncertainty realization.

17. The system of claim 15 wherein the instructions comprise instructions to generate stratigraphic function values for the structural uncertainty realization of the node-based mesh.

18. One or more non-transitory computer-readable storage media that comprise computer-executable instructions to instruct a computing device, the instructions comprising instructions to:
receive a node-based mesh that represents a geologic environment and a structural feature in the geologic environment;
define a node-based parameter space for structural uncertainty of nodes that represent the structural feature in the geologic environment;
define a convex hull with respect to nodes of a portion of the mesh wherein the convex hull encompasses at least a portion of nodes that represent the structural feature;
for a system of equations, impose boundary conditions on the nodes of the convex hull and on the at least a portion of the nodes that represent the structural feature;
solve the system of equations for a displacement field, wherein the system of equations are based at least in part on a kernel that smooths the displacement field for the portion of the mesh of the convex hull with respect to another portion of the mesh; and
generate a structural uncertainty realization of the node-based mesh based at least in part on the displacement field.

19. The one or more non-transitory computer-readable storage media of claim 18 comprising instructions to simulate physical phenomena based at least in part on the structural uncertainty realization.

20. The one or more non-transitory computer-readable storage media of claim 18 comprising instructions to define at least one boundary condition based at least in part on sampling of the parameter space.

* * * * *